(12) United States Patent
Matsuda et al.

(10) Patent No.: US 11,967,903 B2
(45) Date of Patent: Apr. 23, 2024

(54) RECTIFIER CIRCUIT AND POWER RECEPTION CONTROL DEVICE

(71) Applicant: Seiko Epson Corporation, Tokyo (JP)

(72) Inventors: Kinya Matsuda, Matsumoto (JP); Kazuhiro Maekawa, Chino (JP)

(73) Assignee: SEIKO EPSON CORPORATION (JP)

( * ) Notice: Subject to any disclaimer, the term of this patent is extended or adjusted under 35 U.S.C. 154(b) by 157 days.

(21) Appl. No.: 17/679,236

(22) Filed: Feb. 24, 2022

(65) Prior Publication Data

US 2022/0271665 A1    Aug. 25, 2022

(30) Foreign Application Priority Data

Feb. 25, 2021  (JP) ................................ 2021-028263
Aug. 27, 2021  (JP) ................................ 2021-138677

(51) Int. Cl.
*H02M 3/158* (2006.01)
*H01L 29/66* (2006.01)
*H01L 29/872* (2006.01)

(52) U.S. Cl.
CPC ...... *H02M 3/158* (2013.01); *H01L 29/66143* (2013.01); *H01L 29/872* (2013.01)

(58) Field of Classification Search
CPC . H02M 3/158; H01L 29/66143; H01L 29/872
See application file for complete search history.

(56) References Cited

U.S. PATENT DOCUMENTS

| 5,544,038 | A | * | 8/1996 | Fisher ................... | H02M 7/003 |
| | | | | | 327/434 |
| 6,324,084 | B1 | * | 11/2001 | Fujisawa ............... | H02M 7/219 |
| | | | | | 363/127 |
| 9,257,915 | B2 | * | 2/2016 | Oki ........................ | H02M 7/06 |
| 2006/0108605 | A1 | * | 5/2006 | Yanagihara ....... | H01L 29/66143 |
| | | | | | 257/481 |

(Continued)

FOREIGN PATENT DOCUMENTS

JP    2007-020307 A    1/2007
JP    2013-255392 A    12/2013

*Primary Examiner* — Rafael O De Leon Domenech
(74) *Attorney, Agent, or Firm* — Harness, Dickey & Pierce, P.L.C.

(57) ABSTRACT

A rectifier circuit includes: a first input line to which a first alternating-current voltage is supplied and that is wired along a first direction; a second input line to which a second alternating-current voltage is supplied and that is wired along the first direction on a second direction side of the first input line; a first output line that is configured to output a first rectified voltage and is wired along the second direction; a second output line that is configured to output a second rectified voltage and is wired along the second direction on a first direction side of the first output line; a first rectifier element that is arranged corresponding to an intersection of the first input line and the first output line; a second rectifier element that is arranged corresponding to an intersection of the second input line and the first output line; a third rectifier element that is arranged corresponding to an intersection of the first input line and the second output line; and a fourth rectifier element that is arranged corresponding to an intersection of the second input line and the second output line.

13 Claims, 16 Drawing Sheets

(56) References Cited

U.S. PATENT DOCUMENTS

| | | | | |
|---|---|---|---|---|
| 2009/0278513 A1* | 11/2009 | Bahramian | ......... | H01L 27/0605 |
| | | | | 257/140 |
| 2012/0044729 A1* | 2/2012 | Coleman | ............ | H02M 1/4258 |
| | | | | 363/126 |
| 2018/0183429 A1* | 6/2018 | Chen | ................. | H01L 23/49562 |
| 2019/0006954 A1* | 1/2019 | Hwang | ................ | H02M 7/219 |
| 2020/0119654 A1* | 4/2020 | Jun | ....................... | H02M 7/003 |

* cited by examiner

FIG. 2
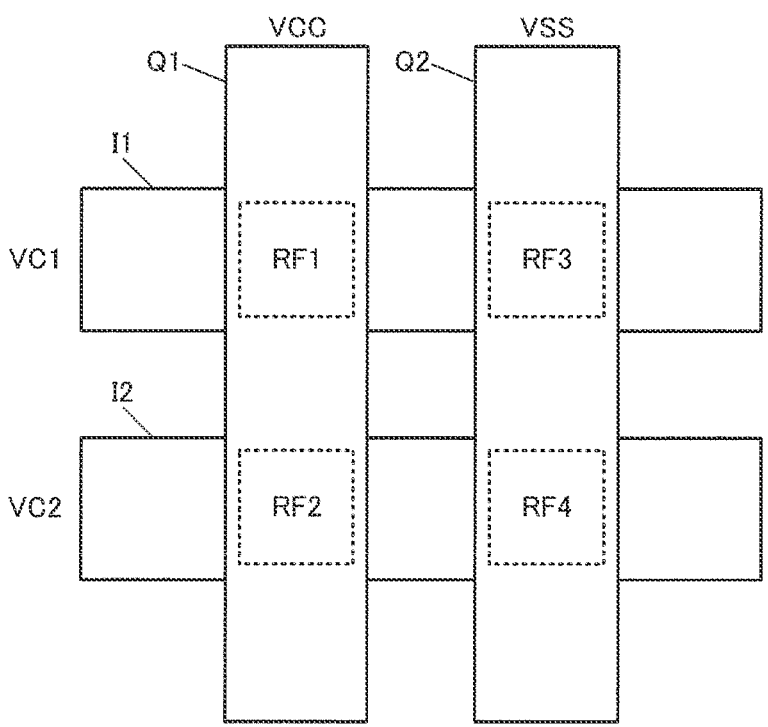
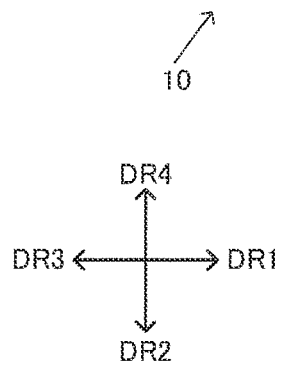

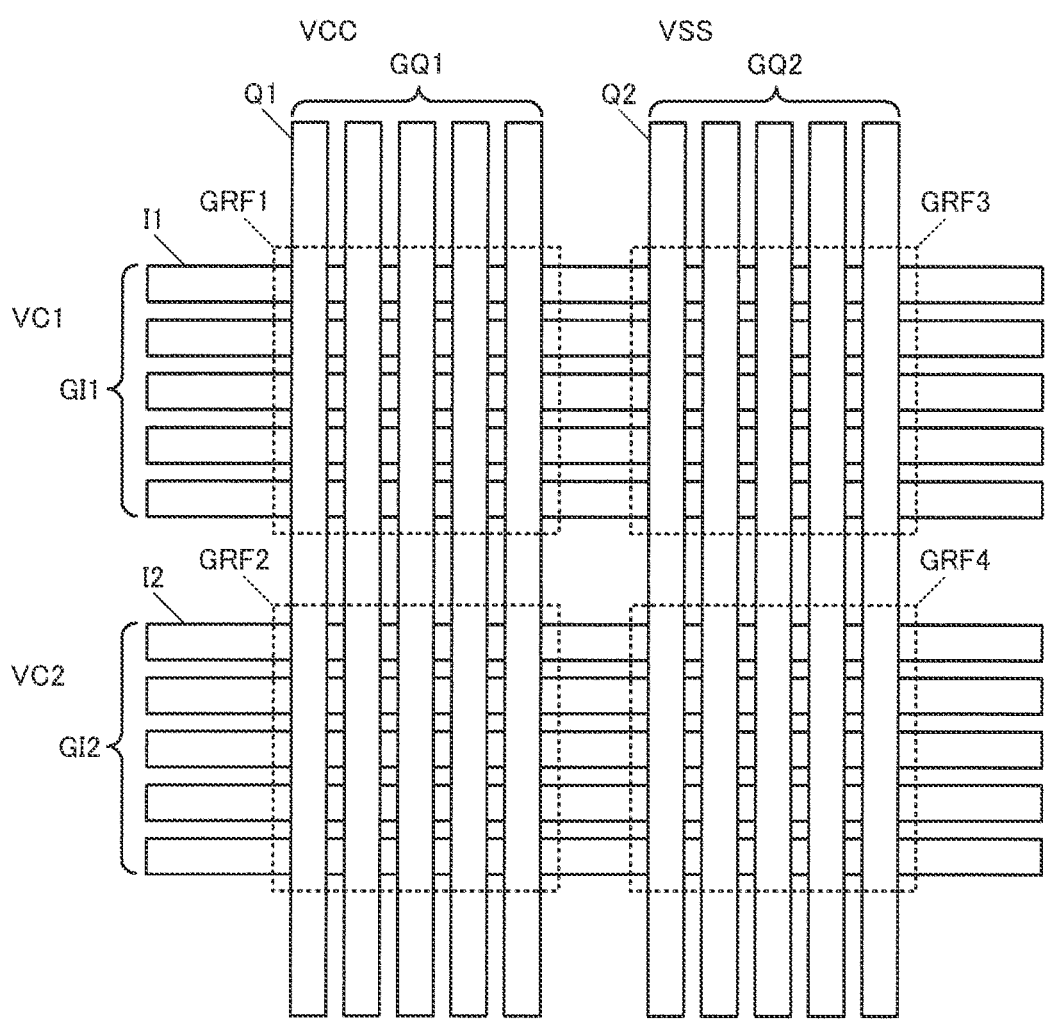
FIG. 3
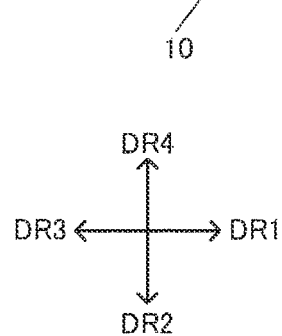

RECTIFIER CIRCUIT AND POWER RECEPTION CONTROL DEVICE

The present application is based on, and claims priority from JP Application Serial Number 2021-028263, filed Feb. 25, 2021 and JP Application Serial Number 2021-138677, filed Aug. 27, 2021, the disclosures of which are hereby incorporated by reference herein in their entireties.

BACKGROUND

1. Technical Field

The present disclosure relates to a rectifier circuit and a power reception control device.

2. Related Art

In the related art, a rectifier circuit that rectifies an alternating-current voltage and outputs the rectified voltage is known. For example, a circuit disclosed in JP-A-2013-255392 is known as a technique for such a rectifier circuit. In the rectifier circuit disclosed in JP-A-2013-255392, a Schottky diode is used as a rectifier element on a high potential side that is an upper side, and an N-type transistor is used as a rectifier element on a low potential side that is a bottom side.

However, although JP-A-2013-255392 discloses a circuit configuration of the rectifier circuit, it does not disclose a layout arrangement of the rectifier circuit. In particular, JP-A-2013-255392 does not propose a layout arrangement that can reduce power loss during power reception.

SUMMARY

An aspect of the present disclosure relates to a rectifier circuit that receives a first alternating-current voltage and a second alternating-current voltage whose phase is opposite to a phase of the first alternating-current voltage and outputs a first rectified voltage on a high potential side and a second rectified voltage on a low potential side. The rectifier circuit includes: a first input line to which the first alternating-current voltage is supplied and that is wired along a first direction; a second input line to which the second alternating-current voltage is supplied and that is wired along the first direction on a second direction side of the first input line when a direction orthogonal to the first direction is defined as a second direction; a first output line that is an output line of the first rectified voltage and is wired along the second direction; a second output line that is an output line of the second rectified voltage and is wired along the second direction on a first direction side of the first output line; a first rectifier element that is arranged corresponding to an intersection of the first input line and the first output line in a plan view and is coupled between the first input line and the first output line; a second rectifier element that is arranged corresponding to an intersection of the second input line and the first output line in the plan view and is coupled between the second input line and the first output line; a third rectifier element that is arranged corresponding to an intersection of the first input line and the second output line in the plan view and coupled between the first input line and the second output line; and a fourth rectifier element that is arranged corresponding to an intersection of the second input line and the second output line in the plan view and is coupled between the second input line and the second output line.

Another aspect of the present disclosure relates to a power reception control device including: a power reception circuit including the rectifier circuit described above; and a power supply circuit configured to supply power based on reception power of the power reception circuit.

BRIEF DESCRIPTION OF THE DRAWINGS

FIG. 2 shows a layout arrangement example of the rectifier circuit according to the present embodiment.

FIG. 3 shows a detailed layout arrangement example of the rectifier circuit according to the present embodiment.

DESCRIPTION OF EXEMPLARY EMBODIMENTS

Hereinafter, a preferred embodiment of the present disclosure will be described in detail. The present embodiment to be described below does not unduly limit contents of the present disclosure described in the claims, and all configurations described in the present embodiment are not necessarily essential as means for solving the present disclosure.

1. Rectifier Circuit

Figure 1:
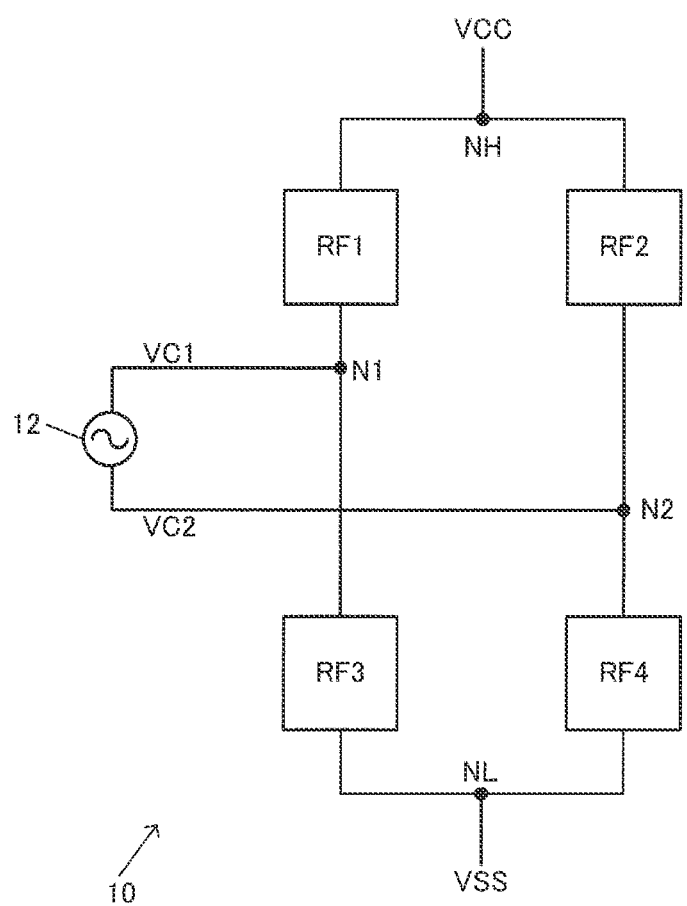
FIG. 1 shows a configuration example of a rectifier circuit according to an embodiment.

FIG. 1 shows a configuration example of a rectifier circuit 10 according to the present embodiment. The rectifier circuit 10 receives alternating-current voltages VC1 and VC2 and outputs rectified voltages VCC and VSS. The alternating-current voltage VC1 is a first alternating-current voltage. The alternating-current voltage VC2 is a second alternating-current voltage whose phase is opposite to that of the alternating-current voltage VC1. The rectified voltage VCC is a first rectified voltage on a high potential side. The rectified voltage VSS is a second rectified voltage on a low potential side. That is, the rectifier circuit 10 receives the VC1 that is the first alternating-current voltage and the VC2 that is the second alternating-current voltage whose phase is opposite to that of the VC1, and outputs, for example, by a full-wave rectification, the VCC that is the first rectified voltage on the high potential side and the VSS that is the second rectified voltage on the low potential side. In FIG. 1, the alternating-current voltages VC1 and VC2 are supplied from an alternating-current power supply 12.

The rectifier circuit 10 includes rectifier elements RF1, RF2, RF3, and RF4. The RF1 is a first rectifier element. The RF2 is a second rectifier element. The RF3 is a third rectifier element. The RF4 is a fourth rectifier element. Diodes can be used as the rectifier elements as described later, and Schottky diodes can be preferably used. Transistors may also be used as the rectifier elements. The rectifier element RF1 is provided between a node N1 that is an input node of the alternating-current voltage VC1 and a node NH that is an output node of the rectified voltage VCC, and has a forward direction that is a direction from the node N1 toward the node NH. The forward direction is a rectification direction. The rectifier element RF2 is provided between a node N2 that is an input node of the alternating-current voltage VC2 and the node NH, and has a forward direction that is a direction from the node N2 toward the node NH. The rectifier element RF3 is provided between a node NL that is an output node of the rectified voltage VSS and the node N1, and has a forward direction that is a direction from the node NL toward the node N1. The rectifier element RF4 is provided between the node NL and the node N2, and has a forward direction that is a direction from the node NL toward the node N2. The rectifier circuit 10 in the present embodiment is not limited to the configuration in FIG. 1, and may be modified by adding other components.

FIG. 2 shows a layout arrangement example of the rectifier circuit 10 according to the present embodiment. FIG. 2 shows a layout arrangement of circuit elements and wirings in a plan view in a direction orthogonal to a semiconductor substrate on which the rectifier circuit 10 is formed. In FIG. 2, a direction orthogonal to a direction DR1 is a direction DR2. A direction opposite to the direction DR1 is a direction DR3. A direction opposite to the direction DR2 is a direction DR4. The directions DR1, DR2, DR3, and DR4 are a first direction, a second direction, a third direction, and a fourth direction, respectively. In FIG. 2, the directions DR1, DR2, DR3, and DR4 are a rightward direction, a downward direction, a leftward direction, and an upward direction on a paper surface, respectively, but the present embodiment is not limited thereto. Various modifications can be performed, and for example, the directions DR1 and DR3 may be the leftward direction and the rightward direction, and the directions DR2 and DR4 may be the upward direction and the downward direction.

The rectifier circuit 10 includes the rectifier elements RF1, RF2, RF3, and RF4 described in FIG. 1, input lines I1 and I2, and output lines Q1 and Q2. The input line I1 is a first input line. The input line I2 is a second input line. The output line Q1 is a first output line. The output line Q2 is a second output line.

The input line I1 that is the first input line is supplied with the VC1 that is the first alternating-current voltage, and is wired along the direction DR1. That is, the input line I1 is wired with the direction DR1 as a longitudinal direction. The direction DR1 is the first direction. The input line I2 that is the second input line is wired along the direction DR1 on the direction DR2 side of the input line I1 when the direction orthogonal to the direction DR1 is defined as the direction DR2. That is, the input line I2 is arranged on the direction DR2 side of the input line I1, and is wired with the direction DR1 as a longitudinal direction. The direction DR2 is the second direction. The output line Q1 that is the first output line is an output line of the VCC that is the first rectified voltage on the high potential side, and is wired along the direction DR2. That is, the output line Q1 is wired with the direction DR2 as a longitudinal direction, and outputs the rectified voltage VCC rectified by the rectifier circuit 10. The output line Q2 that is the second output line is an output line of the VSS that is the second rectified voltage on the low potential side, and is wired along the direction DR2 on the direction DR1 side of the output line Q1. That is, the output line Q2 is arranged on the direction DR1 side of the output line Q1, is wired with the direction DR2 as a longitudinal direction, and outputs the rectified voltage VSS rectified by the rectifier circuit 10.

The RF1 that is the first rectifier element is arranged corresponding to an intersection of the input line I1 and the output line Q1 in the plan view, and is coupled between the input line I1 and the output line Q1. That is, as shown in FIG. 1, the rectifier element RF1 is coupled between the input line I1 of the alternating-current voltage VC1 corresponding to the node N1 and the output line Q1 of the rectified voltage VCC corresponding to the node NH, and executes a rectification operation with a direction from the input line I1 to the output line Q1 as the forward direction. The rectifier element RF1 is arranged, for example, in a region corresponding to an intersection region of the input line I1 and the output line Q1. The plan view is, for example, the plan view in the direction orthogonal to the semiconductor substrate on which the rectifier circuit 10 is formed.

The RF2 that is the second rectifier element is arranged corresponding to an intersection of the input line I2 and the output line Q1 in the plan view, and is coupled between the input line I2 and the output line Q1. That is, as shown in FIG. 1, the rectifier element RF2 is coupled between the input line I2 of the alternating-current voltage VC2 corresponding to the node N2 and the output line Q1 of the rectified voltage VCC corresponding to the node NH, and executes a rectification operation with a direction from the input line I2 to the output line Q1 as the forward direction. The rectifier element RF2 is arranged, for example, in a region corresponding to an intersection region of the input line I2 and the output line Q1.

The third rectifier element RF3 is arranged corresponding to an intersection of the input line I1 and the output line Q2 in the plan view, and is coupled between the input line I1 and the output line Q2. That is, as shown in FIG. 1, the rectifier element RF3 is coupled between the input line I1 of the alternating-current voltage VC1 corresponding to the node N1 and the output line Q2 of the rectified voltage VSS corresponding to the node NL, and executes a rectification operation with a direction from the output line Q2 to the input line I1 as the forward direction. The rectifier element RF3 is arranged, for example, in a region corresponding to an intersection region of the input line I1 and the output line Q2.

The fourth rectifier element RF4 is arranged corresponding to an intersection of the input line I2 and the output line Q2 in the plan view, and is coupled between the input line I2 and the output line Q2. That is, as shown in FIG. 1, the rectifier element RF4 is coupled between the input line I2 of the alternating-current voltage VC2 corresponding to the node N2 and the output line Q2 of the rectified voltage VSS corresponding to the node NL, and executes a rectification operation with a direction from the output line Q2 to the input line I2 as the forward direction. The rectifier element RF4 is arranged, for example, in a region corresponding to an intersection region of the input line I2 and the output line Q2.

In the present embodiment as described above, the input lines I1 and I2 of the alternating-current voltages VC1 and VC2 are wired along the direction DR1. The output lines Q1 and Q2 of the rectified voltages VCC and VSS are wired along the direction DR2 orthogonal to the direction DR1. The rectifier elements RF1 and RF2 are arranged in regions corresponding to the intersection of the input line I1 and the output line Q1 and the intersection of the input line I2 and the output line Q1. The rectifier elements RF3 and RF4 are arranged in regions corresponding to the intersection of the input line I1 and the output line Q2 and the intersection of the input line I2 and the output line Q2. Therefore, a parasitic resistance between the input line I1 and one end of the rectifier element RF1 and a parasitic resistance between the other end of the rectifier element RF1 and the output line Q1 can be reduced. A parasitic resistance between the input line I2 and one end of the rectifier element RF2 and a parasitic resistance between the other end of the rectifier element RF2 and the output line Q1 can be reduced. Similarly, a parasitic resistance between the input line I1 and one end of the rectifier element RF3 and a parasitic resistance between the other end of the rectifier element RF3 and the output line Q2 can be reduced. A parasitic resistance between the input line I2 and one end of the rectifier element RF4 and a parasitic resistance between the other end of the rectifier element RF4 and the output line Q2 can be reduced. By reducing the parasitic resistances as described above, impedance can be reduced in the rectification operation, and power reception loss of the rectifier circuit 10 can be reduced. The efficient layout arrangement of the rectifier elements RF1, RF2, RF3, and RF4 and an efficient layout wiring of the input lines I1 and I2 and the output lines Q1 and Q2 can be implemented, and a layout area of the rectifier circuit 10 can be reduced.

FIG. 3 shows a detailed layout arrangement example of the rectifier circuit 10 according to the present embodiment. In FIG. 3, the rectifier circuit 10 includes an input line group GI1 including input lines I1, an input line group GI2 including input lines I2, an output line group GQ1 including output lines Q1, and an output line group GQ2 including output lines Q2. The input line group GI1 is a first input line group. The input line group GI2 is a second input line group. The output line group GQ1 is a first output line group. The output line group GQ2 is a second output line group.

As shown in FIG. 3, input lines of the input line group GI1 are arranged along the direction DR1. Input lines of the input line group GI2 are arranged along the direction DR1 on the direction DR2 side of the input line group GI1. Output lines of the output line group GQ1 are arranged along the direction DR2 orthogonal to the direction DR1. Output lines of the output line group GQ2 are wired along the direction DR2 on the direction DR1 side of the output line group GQ1. For example, the output line group GQ1 is wired to intersect the input line groups GI1 and GI2. The output line group GQ2 is wired to intersect the input line groups GI1 and GI2 on the direction DR1 side of the output line group GQ1. In this way, the alternating-current voltages VC1 and VC2 are input to the rectifier circuit 10 by the plural input lines of the input line groups GI1 and GI2, and the rectified voltages VCC and VSS can be output from the rectifier circuit 10 by the plural output lines of the output line groups GQ1 and GQ2. Accordingly, the power reception loss can be reduced by reducing parasitic resistances, for example, and an appropriate layout wiring can be implemented.

In FIG. 3, the rectifier circuit 10 includes a rectifier element group GRF1 including rectifier elements RF1 and a rectifier element group GRF2 including rectifier elements RF2. The rectifier element group GRF1 is a first rectifier element group. The rectifier element group GRF2 is a second rectifier element group. The rectifier element group GRF1 is arranged corresponding to an intersection of the input line group GI1 and the output line group GQ1. The rectifier element group GRF2 is arranged corresponding to an intersection of the input line group GI2 and the output line group GQ1. For example, the rectifier element group GRF1 is arranged in a region corresponding to an intersection region of the input line group GI1 and the output line group GQ1. The rectifier element group GRF2 is arranged in a region corresponding to an intersection region of the input line group GI2 and the output line group GQ1. Specifically, the rectifier element group GRF1 includes, for example, a plurality of rectifier elements provided in parallel. The rectifier element group GRF2 includes, for example, a plurality of rectifier elements provided in parallel. For example, each of the rectifier elements of the rectifier element group GRF1 is arranged in a region corresponding to an intersection region of a corresponding input line of the input line group GI1 and a corresponding output line of the output line group GQ1. Each of the rectifier elements of the rectifier element group GRF2 is arranged in a region corresponding to an intersection region of a corresponding input line of the input line group GI2 and a corresponding output line of the output line group GQ1. In this way, the rectifier circuit 10 can execute the rectification operation by the rectifier element group GRF1 including the plurality of rectifier elements and the rectifier element group GRF2 including the plurality of rectifier elements, for example. Therefore, the power reception loss of the rectifier circuit can be further reduced and an efficient rectification operation can be implemented.

The rectifier circuit 10 includes a rectifier element group GRF3 including rectifier elements RF3 and a rectifier element group GRF4 including rectifier elements RF4. The rectifier element group GRF3 is a third rectifier element group. The rectifier element group GRF4 is a fourth rectifier element group. The rectifier element group GRF3 is arranged corresponding to an intersection of the input line group GI1 and the output line group GQ2. The rectifier element group GRF4 is arranged corresponding to an intersection of the input line group GI2 and the output line group GQ2. For example, the rectifier element group GRF3 is arranged in a region corresponding to an intersection region of the input line group GI1 and the output line group GQ2. The rectifier element group GRF4 is arranged in a region corresponding to an intersection region of the input line group GI2 and the output line group GQ2. Specifically, the rectifier element group GRF3 includes, for example, a plurality of rectifier elements provided in parallel, and the rectifier element group GRF4 includes, for example, a plurality of rectifier elements provided in parallel. For example, each of the rectifier elements of the rectifier element group GRF3 is arranged in a region corresponding to an intersecting region of a corresponding input line of the input line group GI1 and a corresponding output line of the output line group GQ2. Each of the rectifier elements of the rectifier element group GRF4 is arranged in a region corresponding to an intersecting region of a corresponding input line of the input line group GI2 and a corresponding output line of the output line group GQ2.

2. Detailed Configuration Example of Rectifier Circuit

Figure 4:
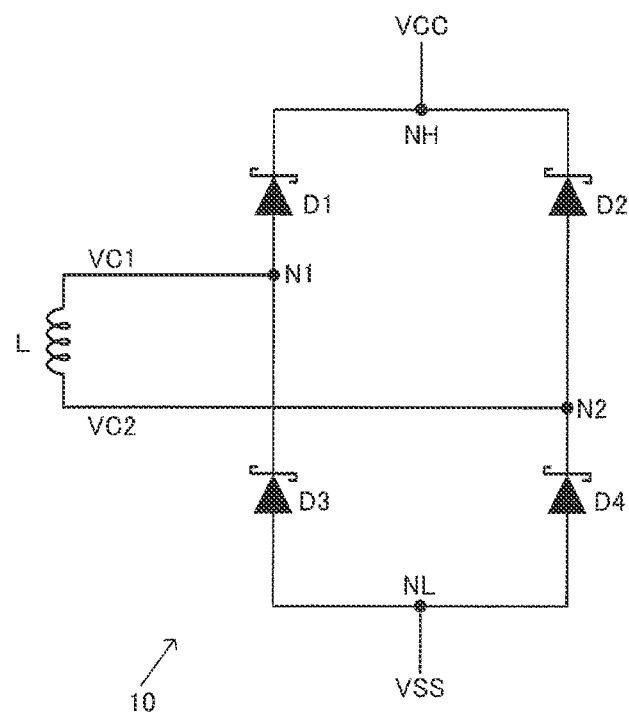
FIG. 4 shows a first configuration example of the rectifier circuit according to the present embodiment.

FIG. 4 shows a first configuration example of the rectifier circuit 10. In FIG. 4, diodes D1 and D2 are provided as the rectifier elements RF1 and RF2 in FIG. 4. The diode D1 is a first diode, specifically, a first Schottky barrier diode. The diode D2 is a second diode, specifically, a second Schottky barrier diode. In FIG. 4, diodes D3 and D4 are provided as the rectifier elements RF3 and RF4. The diode D3 is a third diode, specifically, a third Schottky barrier diode. The diode D4 is a fourth diode, specifically, a fourth Schottky barrier diode. A Schottky barrier diode is a diode that utilizes a Schottky barrier generated by bonding a metal and a semiconductor. Since the Schottky barrier diode is operated by a large number of carriers, the Schottky barrier diode has a feature that forward voltage drop is smaller and a switching speed is higher than that of a PN junction diode. Further, a modification in which PN junction diodes are used as the diodes D1, D2, D3, and D4 can also be made. The PN junction diode is a diode formed by joining a P-type semiconductor region and an N-type semiconductor region.

Figure 5:
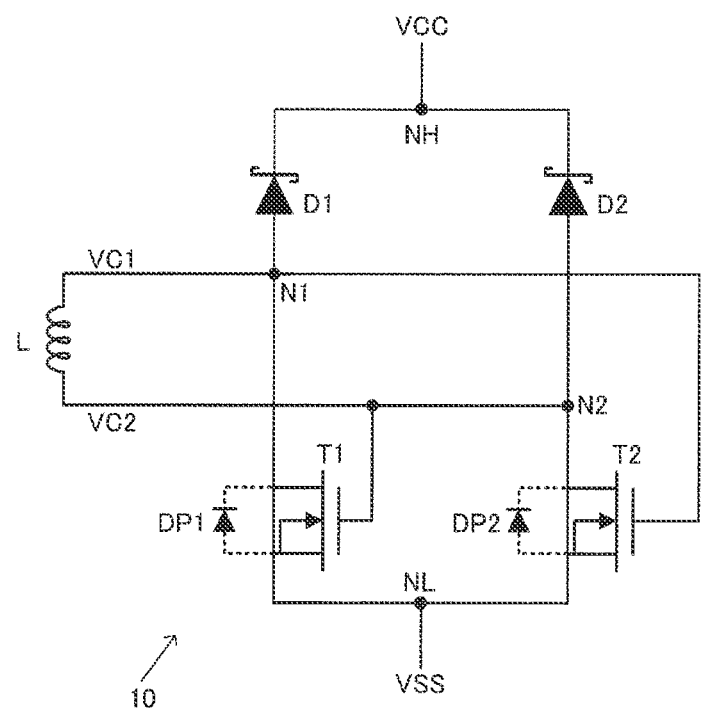
FIG. 5 shows a second configuration example of the rectifier circuit according to the present embodiment.
Figure 6:
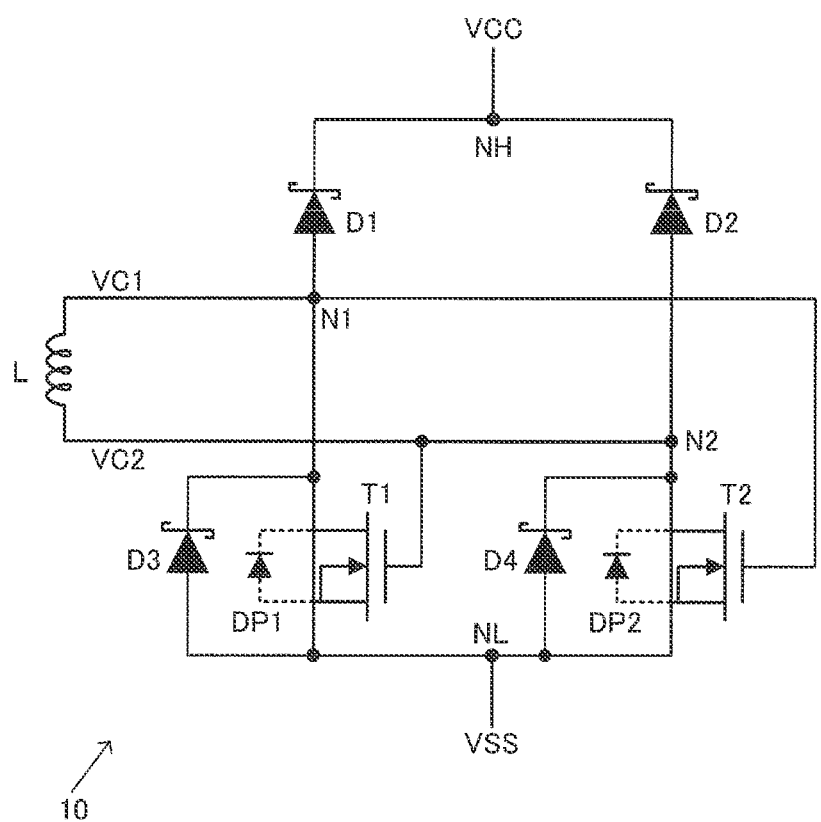
FIG. 6 shows a third configuration example of the rectifier circuit according to the present embodiment.

In the diodes D1 and D2, the node NH that is the output node of the rectified voltage VCC is a cathode. In the diode D1, the node N1 that is the input node of the alternating-current voltage VC1 is an anode. In the diode D2, the node N2 that is the input node of the alternating-current voltage VC2 is an anode. In the diodes D3 and D4, the node NL that is the output node of the rectified voltage VSS is an anode. In the diode D3, the node N1 is a cathode. In the diode D4, the node N2 is a cathode. In FIG. 4 and FIGS. 5 and 6 to be described later, the alternating-current voltage VC1 is output from one end of a coil L that receives power, and the alternating-current voltage VC2 is output from the other end of the coil L. The coil L is, for example, a secondary coil L2 in contactless power transmission in FIG. 17 to be described later, and receives power transmitted by a power transmission device 70.

FIG. 5 shows a second configuration example of the rectifier circuit 10. In FIG. 5, the diodes D1 and D2 are provided as the rectifier elements RF1 and RF2, and transistors T1 and T2 are provided as the rectifier elements RF3 and RF4. In FIG. 5, the diodes D1 and D2 are the Schottky barrier diodes, and a modification in which the diodes D1 and D2 are the PN junction diodes can also be made. The transistor T1 is a first transistor. The transistor T2 is a second transistor. The transistors T1 and T2 are, for example, N-type transistors, and are, for example, N-type MOS transistors. A gate of the transistor T1 is coupled to the node N2 that is the input node of the alternating-current voltage VC2. A gate of the transistor T2 is coupled to the node N1 that is the input node of the alternating-current voltage VC1. That is, in FIGS. 2 and 3, the gate of the transistor T1 that is the first transistor is coupled to the input line I2 that is the second input line. The gate of the transistor T2 that is the second transistor is coupled to the input line I1 that is the first input line. A parasitic diode DP1 is formed between a drain and a source of the transistor T1, and also functions as the rectifier element RF3. A parasitic diode DP2 is formed between a drain and a source of the transistor T2, and also functions as the rectifier element RF4. The parasitic diode DP1 is formed by PN junction between the drain and the source of the transistor T1. The parasitic diode DP2 is formed by PN junction between the drain and the source of the transistor T2. The parasitic diodes DP1 and DP2 are also called body diodes.

FIG. 6 shows a third configuration example of the rectifier circuit 10. In FIG. 6, the diodes D1 and D2 are provided as the rectifier elements RF1 and RF2. The transistor T1 that is the first transistor and the diode D3 that is coupled in parallel to the transistor T1 are provided as the rectifier element RF3. The diode D3 is the third Schottky barrier diode. The transistor T2 that is the second transistor and the diode D4 that is coupled in parallel to the transistor T2 are provided as the rectifier element RF4. The diode D4 is the fourth Schottky barrier diode. The gate of the transistor T1 is coupled to the node N2, and is coupled to the input line I2 in FIGS. 2 and 3. The gate of the transistor T2 is coupled to the node N1, and is coupled to the input line I1 in FIGS. 2 and 3. A modification in which the PN junction diodes are provided as the diodes D1, D2, D3, and D4 can also be made.

Figure 7:
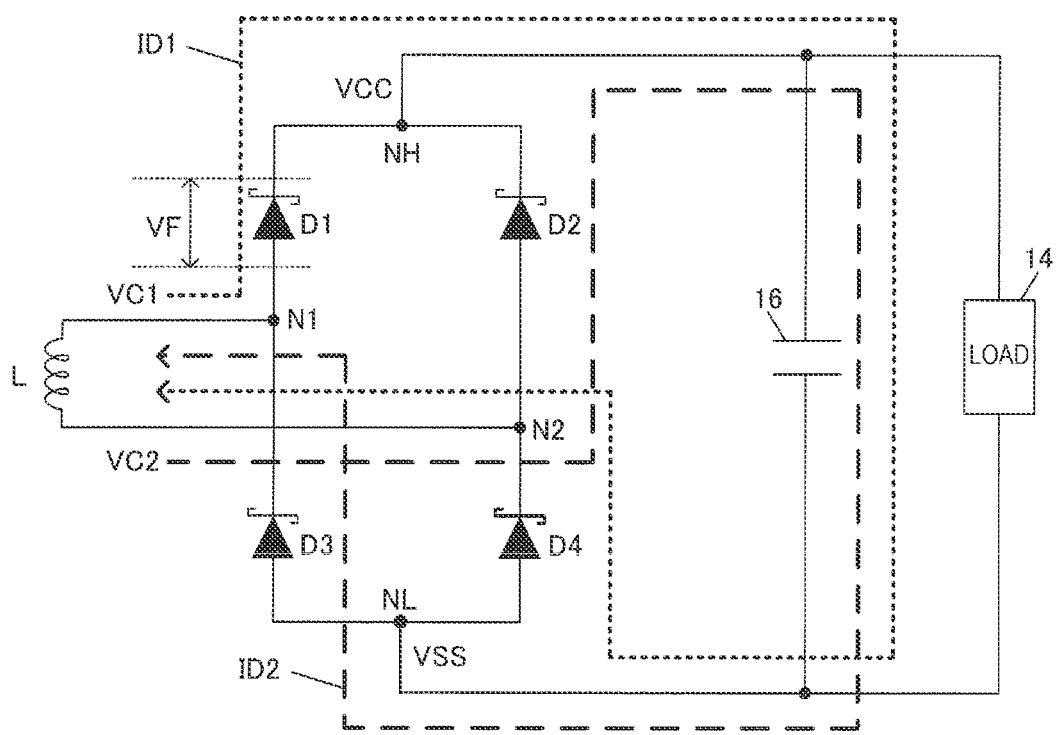
FIG. 7 is a diagram showing an operation of the rectifier circuit according to the first configuration example.
Figure 8:
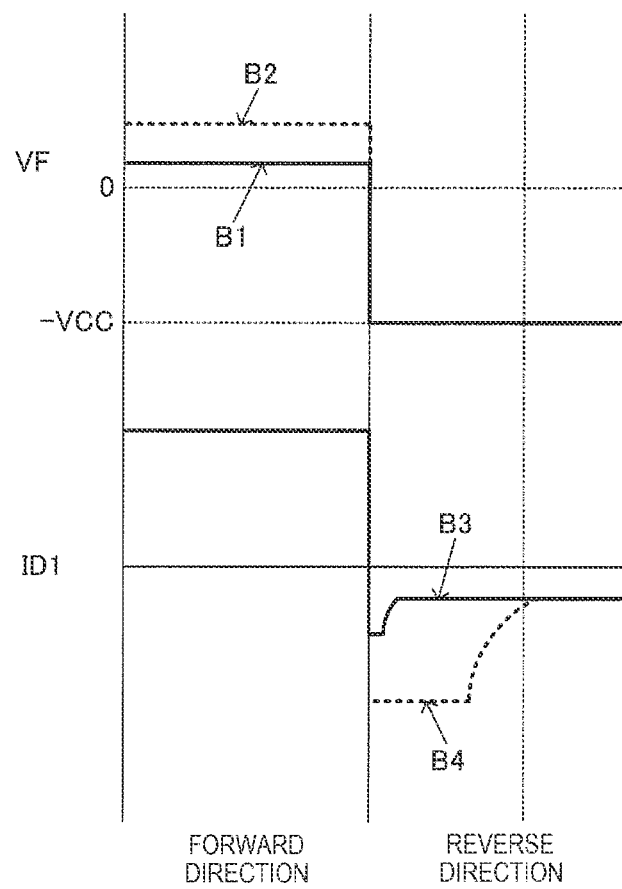
FIG. 8 is a diagram showing the operation of the rectifier circuit according to the first configuration example.

FIGS. 7 and 8 are diagrams showing an operation of the rectifier circuit 10 according to the first configuration example in FIG. 4. As shown in FIG. 7, a current ID1 from the node N1 of the alternating-current voltage VC1 flows to a load 14 through the diode D1, and flows from the load 14 to the node N2 of the alternating-current voltage VC2 through the diode D4. A current ID2 from the node N2 of the alternating-current voltage VC2 flows to the load 14 through the diode D2, and flows from the load 14 to the node N1 of the alternating-current voltage VC1 via the diode D3. Paths through which the currents ID1 and ID2 flow are the same with those in the rectifier circuit 10 according to the second configuration example and the third configuration example in FIGS. 5 and 6. In FIG. 7, a capacitor 16 that smooths the rectified voltages VCC and VSS is provided between the node NH of the rectified voltage VCC and the node NL of the rectified voltage VSS.

FIG. 8 shows a waveform of a forward voltage VF of the diode D1 and a waveform of the current ID1 in FIG. 7. As shown in B1 of FIG. 8, when the diode D1 is the Schottky barrier diode, the forward voltage VF when the current ID1 flows through the diode D1 in the forward direction can be lowered to, for example, about 0.4 V. Meanwhile, as shown in B2, when the diode D1 is the PN junction diode, the forward voltage VF when the current ID1 flows through the diode D1 in the forward direction is, for example, about 0.7 V, which is higher than that when the diode D1 is the Schottky barrier diode. In addition, power loss when a reverse voltage is applied to the diode D1 can be reduced as indicated by B3 in the Schottky barrier diode, and is large as indicated by B4 in the PN junction diode. As described above, using the Schottky barrier diodes as the diodes D1 to D4 is advantageous in that the forward voltages VF can be lowered and the power loss can be reduced as compared with those when the PN junction diodes are used.

Figure 9:
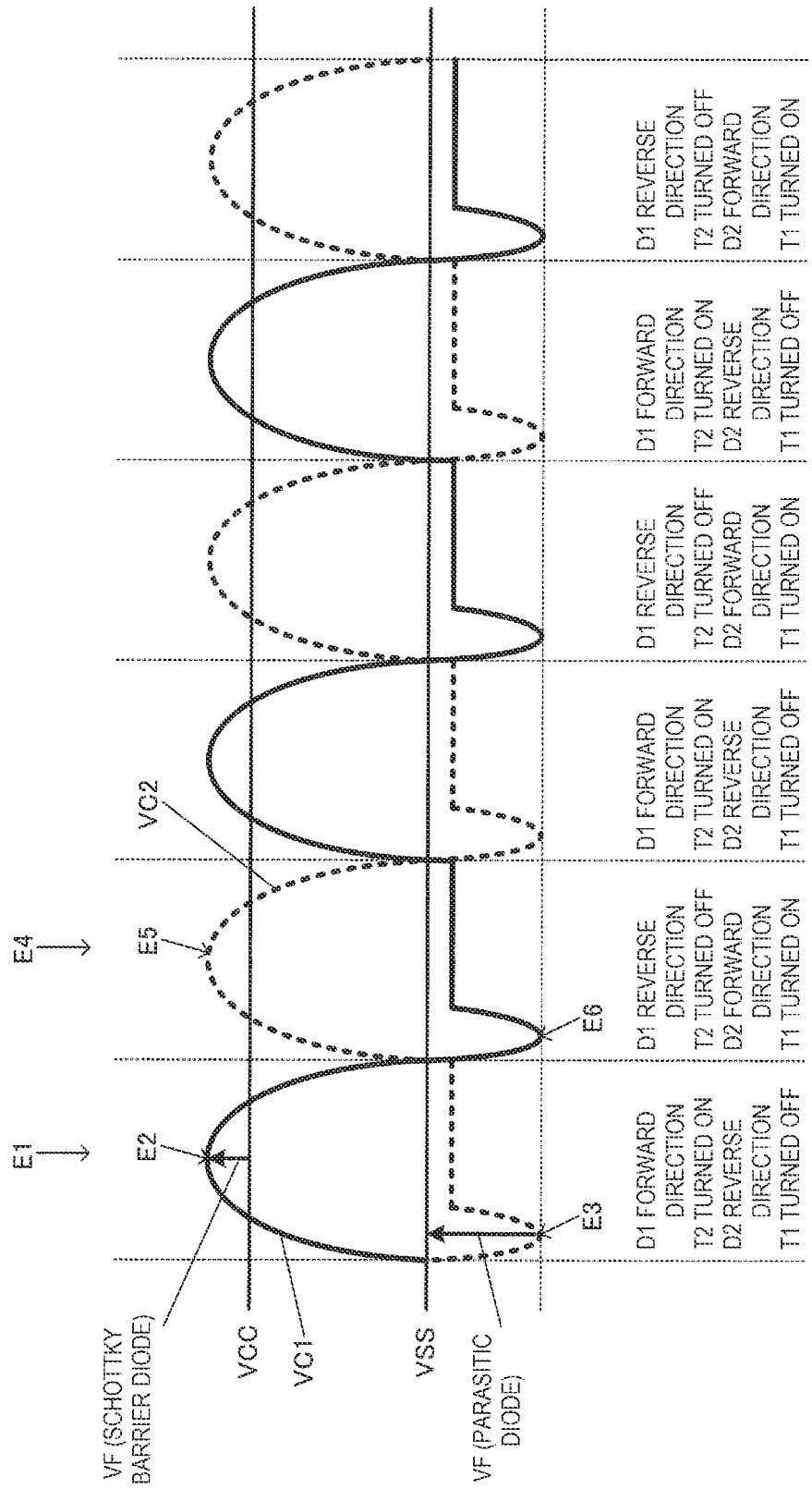
FIG. 9 is a signal waveform diagram showing an operation of the rectifier circuit according to the second configuration example.

FIG. 9 is a signal waveform diagram showing an operation of the rectifier circuit 10 according to the second configuration example in FIG. 5. A period indicated by E1 in FIG. 9 is a period in which a forward voltage is applied to the diode D1 and the transistor T2 is turned on, and a reverse voltage is applied to the diode D2 and the transistor T1 is turned off. Specifically, the transistor T2 is turned on when the alternating-current voltage VC1 exceeds a threshold voltage of the transistor T2. A forward current flows through the diode D1 when the alternating-current voltage VC1 exceeds the rectified voltage VCC. Accordingly, as in FIG. 7, the current ID1 from the node N1 of the alternating-current voltage VC1 flows to the node N2 of the alternating-current voltage VC2 through the diode D1, the load 14, and the transistor T2. At this time, since the forward voltage VF of the Schottky barrier diode is low, the alternating-current voltage VC1 is clamped at a voltage lower than the rectified voltage VCC as indicated by E2. Also in a period in which the alternating-current voltage VC1 is lower than the threshold voltage of the transistor T2 and the transistor T2 is still off, a forward current flows through the parasitic diode DP2, so that the alternating-current voltage VC2 is lower than the rectified voltage VSS by an amount of the forward voltage VF of the parasitic diode DP2 as indicated by E3. A region above the rectified voltage VCC indicated by E2 and a region below the rectified voltage VSS indicated by E3 are power loss regions.

In a period indicated by E4 in FIG. 9, a reverse voltage is applied to the diode D1 and the transistor T2 is turned off, and a forward voltage is applied to the diode D2 and the transistor T1 is turned on. Specifically, the transistor T1 is turned on when the alternating-current voltage VC2 exceeds a threshold voltage of the transistor T1. A forward current flows through the diode D2 when the alternating-current voltage VC2 exceeds the rectified voltage VCC. Accordingly, as in FIG. 7, the current ID2 from the node N2 of the alternating-current voltage VC2 flows to the node N1 of the alternating-current voltage VC1 through the diode D2, the load 14, and the transistor T1. In this case as well, regions indicated by E5 and E6 are power loss regions.

Figure 10:
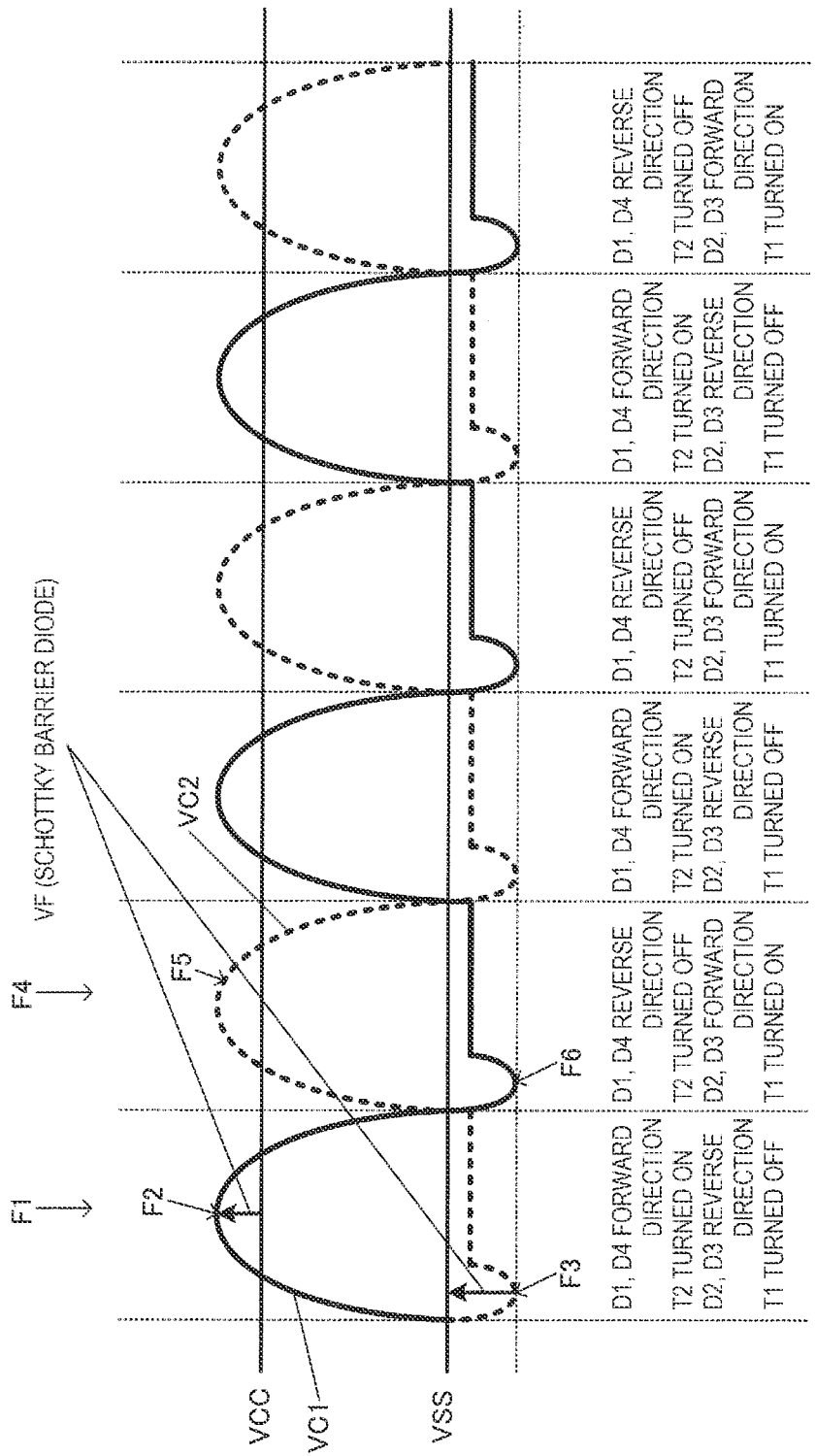
FIG. 10 is a signal waveform diagram showing an operation of the rectifier circuit according to the third configuration example.

FIG. 10 is a signal waveform diagram showing an operation of the rectifier circuit 10 according to the third configuration example in FIG. 6. A period indicated by F1 in FIG. 10 is a period in which a forward voltage is applied to the diodes D1 and D4 and the transistor T2 is turned on, and a reverse voltage is applied to the diodes D2 and D3 and the transistor T1 is turned off. Specifically, the transistor T2 is turned on when the alternating-current voltage VC1 exceeds the threshold voltage of the transistor T2. The forward current flows through the diode D1 when the alternating-current voltage VC1 exceeds the rectified voltage VCC. Accordingly, as in FIG. 7, the current ID1 from the node N1 of the alternating-current voltage VC1 flows to the node N2 of the alternating-current voltage VC2 through the diode D1, the load 14, the transistor T2, and the diode D4. At this time, since the forward voltage VF of the Schottky barrier diode is low, the alternating-current voltage VC1 is clamped at a voltage lower than the rectified voltage VCC as indicated by F2. Also in the period in which the alternating-current voltage VC1 is lower than the threshold voltage of the transistor T2 and the transistor T2 is still off, a current flows through the diode D4 provided in parallel with the transistor T2, so that the alternating-current voltage VC2 is lower than the rectified voltage VSS by an amount of the forward voltage VF of the diode D4 as indicated by F3. In this case, since the diode D4 is the Schottky barrier diode having a low forward voltage VF, a drop voltage from the rectified voltage VSS is smaller in F3 of FIG. 10 than that in E3 of FIG. 9. Therefore, according to the rectifier circuit 10 of the third configuration example in FIGS. 6 and 10, the power loss can be reduced as compared with that of the rectifier circuit 10 of the second configuration example in FIGS. 5 and 9.

A period indicated by F4 in FIG. 10 is a period in which a reverse voltage is applied to the diodes D1 and D4 and the transistor T2 is turned off, and a forward voltage is applied to the diodes D2 and D3 and the transistor T1 is turned on. Specifically, the transistor T1 is turned on when the alternating-current voltage VC2 exceeds the threshold voltage of the transistor T1. The forward current flows through the diode D2 when the alternating-current voltage VC2 exceeds the rectified voltage VCC. Accordingly, as in FIG. 7, the current ID2 from the node N2 of the alternating-current voltage VC2 flows to the node N1 of the alternating-current voltage VC1 through the diode D2, the load 14, the transistor T1, and the diode D3. In this case as well, regions indicated by F5 and F6 are power loss regions, and the power loss is smaller than the regions indicated by E5 and E6 in FIG. 9. Therefore, according to the rectifier circuit 10 of the third configuration example in FIGS. 6 and 10, the power loss can be reduced as compared with that of the rectifier circuit 10 of the second configuration example in FIGS. 5 and 9.

As described above, in the rectifier circuit 10 in FIGS. 4, 5, and 6, the diode D1 that is the first diode is provided as the rectifier element RF1 in FIG. 1, and the diode D2 that is the second diode is provided as the rectifier element RF2. In this way, the rectifier circuit 10 can be operated at a high speed as compared with a case where transistors are used as the rectifier elements RF1 and RF2. Accordingly, for example, even when frequencies of the alternating-current voltages VC1 and VC2 are high, the alternating-current voltages VC1 and VC2 can be appropriately rectified to output the rectified voltages VCC and VSS. That is, when the transistors are used as the rectifier elements RF1 and RF2, it is necessary to control gates of the transistors by feedback control. When such feedback control is performed, delay time is generated, and it is difficult to operate the rectifier circuit 10 at the high speed. For example, when the frequencies of the alternating-current voltages VC1 and VC2 are high, it is difficult to appropriately rectify the alternating-current voltages VC1 and VC2 to output the rectified voltages VCC and VSS. Meanwhile, since such feedback control is not required when the diodes D1 and D2 are used as the rectifier elements RF1 and RF2, the rectifier circuit 10 can be operated at the high speed. Even when the frequencies of the alternating-current voltages VC1 and VC2 are high, the alternating-current voltages VC1 and VC2 can be appropriately rectified to output the rectified voltages VCC and VSS.

In FIGS. 4, 5, and 6, the diode D1 is the Schottky barrier diode, and the diode D2 is also the Schottky barrier diode. When the Schottky barrier diodes are used as the diodes D1 and D2 as described above, the forward voltages VF can be reduced as compared with a case where the PN junction diodes are used as described in B1 and B2 in FIG. 8. By reducing the forward voltages VF in this way, the regions where the alternating-current voltages VC1 and VC2 exceed the rectified voltage VCC can be reduced, for example, as shown in E2 and E5 in FIG. 9 and F2 and F5 in FIG. 10. Therefore, the power loss can be reduced and power reception efficiency of the rectifier circuit 10 can be improved as compared with the case where the PN junction diodes are used.

Further, in FIGS. 5 and 6, the transistor T1 that is the first transistor and has the gate coupled to the input line I2 of the alternating-current voltage VC2 is provided as the rectifier element RF3. The transistor T2 that is the second transistor and has the gate coupled to the input line I1 of the alternating-current voltage VC1 is provided as the rectifier element RF4. In this way, the transistor T1 can be operated as the rectifier element RF3 by inputting the alternating-current voltage VC2 from the input line I2 to the gate of the transistor T1 and turning on and off the transistor T1. The transistor T2 can be operated as the rectifier element RF4 by inputting the alternating-current voltage VC1 from the input line I1 to the gate of the transistor T2 and turning on and off the transistor T2. That is, even when no gate control circuit for controlling the gate of the transistor is provided, the transistors T1 and T2 can be operated as the rectifier elements RF3 and RF4. In addition, drain-source voltages when the transistors T1 and T2 are turned on can be made lower than the forward voltage VF of the diode, which is advantageous in that the forward loss can be reduced.

In FIG. 6, the diode D3 that is the third Schottky barrier diode and is coupled in parallel with the transistor T1 is further provided as the rectifier element RF3. The diode D4 that is the fourth Schottky barrier diode and is coupled in parallel with the transistor T2 is further provided as the rectifier element RF4. In this way, the power loss can be reduced as described in F3 and F6 in FIG. 10 as compared with the configuration in which the diodes D3 and D4 that are the Schottky barrier diodes are not provided as shown in FIG. 5. That is, in the configuration in FIG. 5, the alternating-current voltages VC1 and VC2 are lower than the rectified voltage VSS by the amount of forward voltage VF of a corresponding one of the parasitic diodes DP1 and DP2 that are the PN junction diodes as indicated by E3 and E6 in FIG. 9. Meanwhile, by providing the diodes D3 and D4 that are the Schottky barrier diodes as shown in FIG. 6, the regions where the alternating-current voltages VC1 and VC2 are lower than the rectified voltage VSS can be reduced as indicated by F3 and F6 in FIG. 10. Therefore, the power loss can be reduced and the efficient rectification operation can be implemented.

In FIGS. 4 and 6, the diode D3 that is the third Schottky barrier diode is provided as the rectifier element RF3, and the diode D4 that is the fourth Schottky barrier diode is provided as the rectifier element RF4. In this way, by providing the diodes D3 and D4 that are the Schottky barrier diodes, the forward voltages VF can be lowered and the power loss can be reduced as compared with the case where the PN junction diode is provided.

3. Detailed Layout Arrangement

Figure 11:
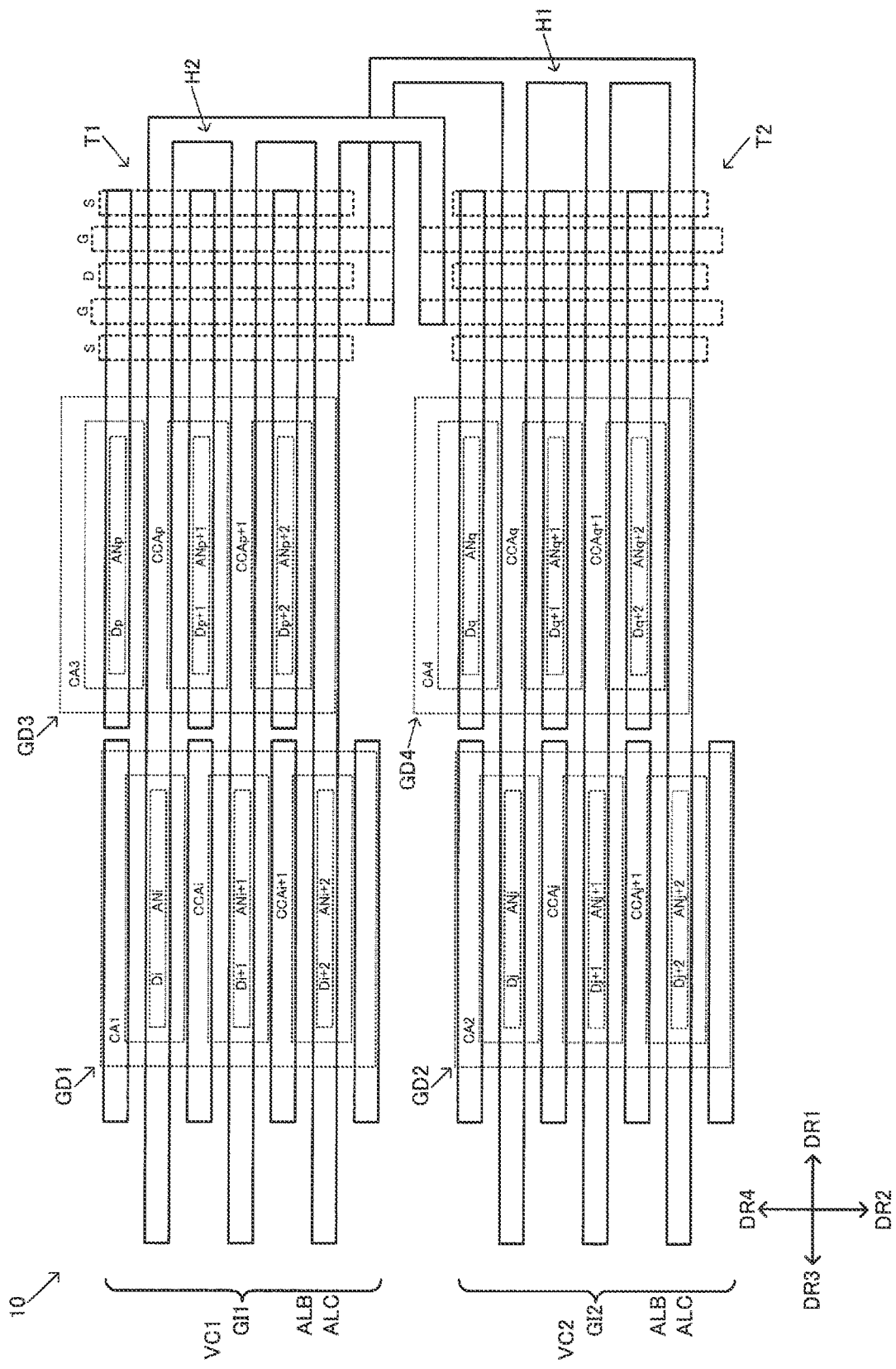
FIG. 11 shows a detailed layout arrangement example of the rectifier circuit according to the present embodiment.
Figure 12:
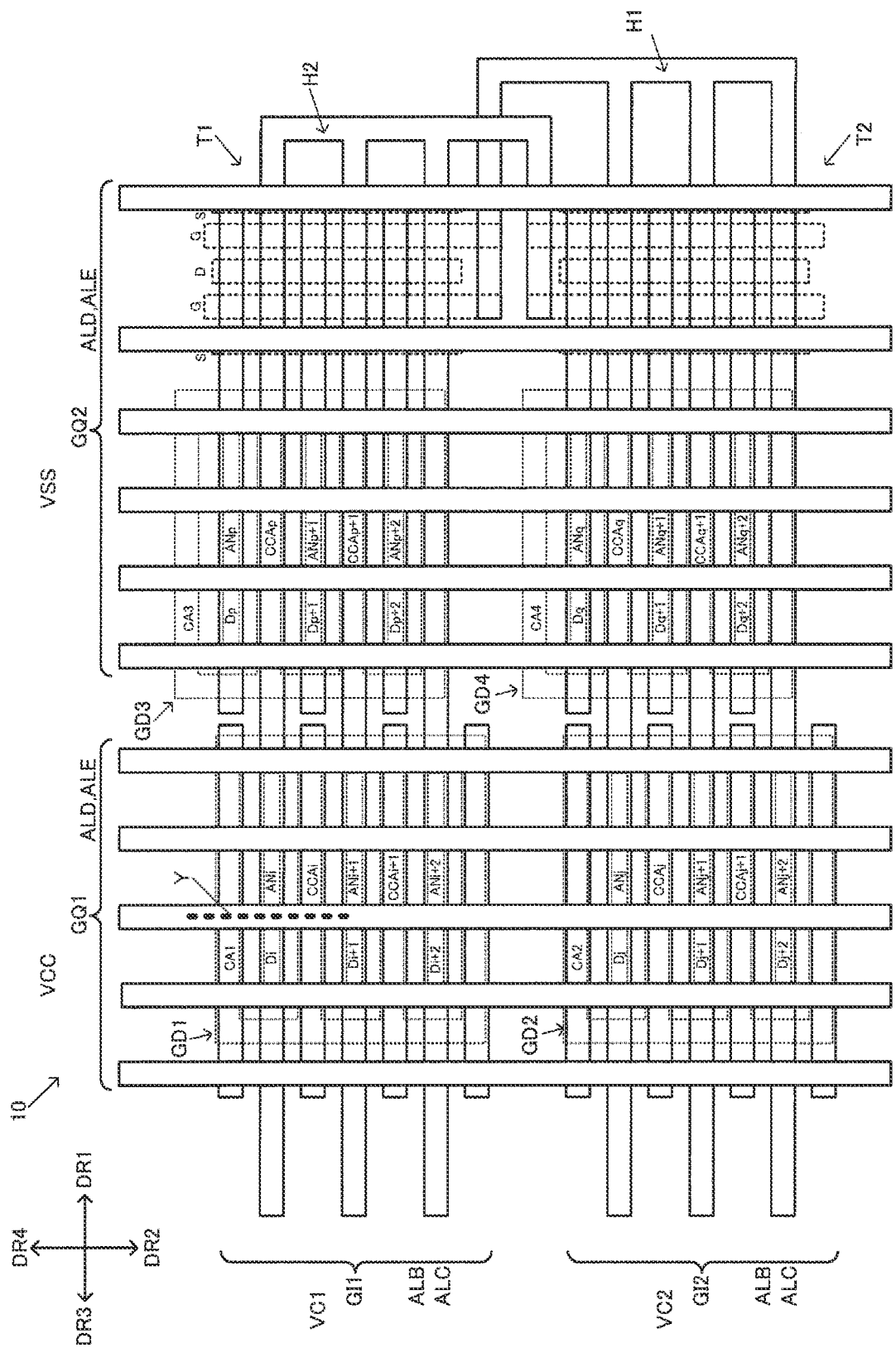
FIG. 12 shows a detailed layout arrangement example of the rectifier circuit according to the present embodiment.

FIGS. 11 and 12 show detailed layout arrangement examples of the rectifier circuit 10 according to the present embodiment. FIGS. 11 and 12 are more detailed layout arrangement examples of the layout arrangement described in FIG. 3. Specifically, FIGS. 11 and 12 are layout arrangement examples of the rectifier circuit 10 according to the third configuration example in FIG. 6.

In FIGS. 11 and 12, the rectifier circuit 10 includes the input line group GI1 in which the input lines are wired along the direction DR1, and the input line group GI2 in which the input lines are wired along the direction DR1 on the direction DR2 side of the input line group GI1. As shown in FIG. 12, the rectifier circuit 10 includes the output line group GQ1 in which the output lines are wired along the direction DR2 orthogonal to the direction DR1, and the output line group GQ2 in which the output lines are wired along the direction DR2 on the direction DR1 side of the output line group GQ1. FIG. 12 is a layout arrangement diagram in which an arrangement of the output line groups GQ1 and GQ2 is added to the arrangement in FIG. 11.

In the rectifier circuit 10 in FIGS. 11 and 12, a diode group GD1 that is a first diode group is provided as the rectifier element group GRF1 in FIG. 3. A diode group GD2 that is a second diode group is provided as the rectifier element group GRF2. A diode group GD3 that is a third diode group is provided as the rectifier element group GRF3. A diode group GD4 that is a fourth diode group is provided as the rectifier element group GRF4. The diode group GD1 is provided corresponding to an intersection of the input line group GI1 and the output line group GQ1. The diode group GD2 is provided corresponding to an intersection of the input line group GI2 and the output line group GQ1. The diode group GD3 is provided corresponding to an intersection of the input line group GI1 and the output line group GQ2. The diode group GD4 is provided corresponding to an intersection of the input line group GI2 and the output line group GQ2. For example, the diode group GD1 is provided in an intersection region of the input line group GI1 and the output line group GQ1. The diode group GD2 is provided in an intersection region of the input line group GI2 and the output line group GQ1. The diode group GD3 is provided in an intersection region of the input line group GI1 and the output line group GQ2. The diode group GD4 is provided in an intersection region of the input line group GI2 and the output line group GQ2. The number of the wirings and the number of diodes are examples in FIGS. 11 and 12. In practice, the number of the wirings and the number of the diodes may be further increased.

Specifically, in FIGS. 11 and 12, diodes Di, Di+1, and Di+2 are provided as the diode group GD1, and diodes Dj, Dj+1, and Dj+2 are provided as the diode group GD2. The diodes Di, Di+1, and Di+2 are an i-th diode, an (i+1)-th diode, and an (i+2)-th diode, respectively. The diodes Dj, Dj+1, and Dj+2 are a j-th diode, a (j+1)-th diode, and a (j+2)-th diode, respectively. Diodes Dp, Dp+1, and Dp+2 are provided as the diode group GD3. Diodes Dq, Dq+1, Dq+2 are provided as the diode group GD4. The diodes Dp, Dp+1, and Dp+2 are a p-th diode, a (p+1)-th diode, and a (p+2)-th diode, respectively. The diodes Dq, Dq+1, and Dq+2 are a q-th diode, a (q+1)-th diode, and a (q+2)-th diode, respectively. Note that i, j, p, and q are, for example, integers equal to or greater than 1.

Specifically, the diode group GD1 includes the diode Di and the diode Di+1 adjacent to the diode Di in the direction DR2. The diode Di that is the i-th diode and the diode Di+1 that is the (i+1)-th diode are arranged side by side along the direction DR2, for example, with the direction DR1 as the longitudinal direction. The diode group GD1 further includes the diode Di+2 adjacent to the diode Di+1 in the direction DR2.

The diode group GD2 includes the diode Dj and the diode Dj+1 adjacent to the diode Dj in the direction DR2. The diode Dj that is the j-th diode and the diode Dj+1 that is the (j+1)-th diode are arranged side by side along the direction DR2, for example, with the direction DR1 as the longitudinal direction. The diode group GD2 further includes the diode Dj+2 adjacent to the diode Dj+1 in the direction DR2.

In this way, the diode Di is arranged below an input line corresponding to the diode Di in the input line group GI1. The diode Di+1 is arranged below an input line corresponding to the diode Di+1 in the input line group GI1. For example, the diodes Di and Di+1 are arranged below corresponding input lines along the longitudinal direction of the input lines to supply the alternating-current voltage VC1 from the input lines. The "below" is a direction from a circuit formation region of the semiconductor substrate toward the semiconductor substrate. The diode Dj is arranged below an input line corresponding to the diode Dj in the input line group GI2. The diode Dj+1 is arranged below an input line corresponding to the diode Dj+1 in the input line group GI2. For example, the diodes Dj and Dj+1 are arranged below corresponding input lines along the longitudinal direction of the input lines to supply the alternating-current voltage VC2 from the input lines. Therefore, the plural diodes of the diode group GD1 can be efficiently arranged in the intersection region of the input line group GI1 and the output line group GQ1, and the plural diodes of the diode group GD2 can be efficiently arranged in the intersection region of the input line group GI2 and the output line group GQ1. The layout area of the rectifier circuit 10 can be reduced. The plural diodes coupled in parallel are provided between the input line group GI1 and the output line group GQ1, and the plural diodes coupled in parallel are provided between the input line group GI2 and the output line group GQ1. Therefore, a current flowing through the rectifier elements can be increased and the efficient rectification operation by the rectifier circuit 10 can be implemented.

In FIGS. 11 and 12, a common cathode CCAi shared by an anode ANi of the diode Di and an anode ANi+1 of the diode Di+1 is provided between the anode ANi and the anode ANi+1. A common cathode CCAi+1 shared by the anode ANi+1 and an anode ANi+2 of the diode Di+2 is provided between the anode ANi+1 and the anode ANi+2. The anodes ANi, ANi+1, and ANi+2 are an i-th anode, an (i+1)-th anode, and an (i+2)-th anode, respectively. The common cathodes CCAi and CCAi+1 are an i-th common cathode and an (i+1)-th common cathode, respectively.

In FIGS. 11 and 12, a common cathode CCAj shared by an anode ANj of the diode Dj and an anode ANj+1 of the diode Dj+1 is provided between the anode ANj and the anode ANj+1. A common cathode CCAj+1 shared by the anode ANj+1 and an anode ANj+2 of the diode Dj+2 is provided between the anode ANj+1 and the anode ANj+2. The anodes ANj, ANj+1, and ANj+2 are a j-th anode, a (j+1)-th anode, and a (j+2)-th anode, respectively. The common cathodes CCAj and CCAj+1 are a j-th common cathode and a (j+1)-th common cathode, respectively.

In this way, in two anodes arranged along the direction DR2, a cathode arranged between the two anodes can be used as a common cathode of the two anodes. Therefore, a length of each of the diode groups in the direction DR2 can be reduced while maintaining the rectified current by each of the diodes, and thus efficiency of the rectification operation by the rectifier circuit 10 can be improved and the area of the rectifier circuit 10 can be reduced.

In FIGS. 11 and 12, a cathode CA1 is provided to surround each of the anodes ANi, ANi+1, and ANi+2. A cathode CA2 is provided to surround each of the anodes ANj, ANj+1, and ANj+2. In this way, currents flow from the anodes ANi, ANi+1, and ANi+2 to the cathode CA1 in the upward, downward, leftward, and rightward directions. Currents flow from the anodes ANj, ANj+1, and ANj+2 to the cathode CA2 in the upward, downward, leftward, and rightward directions. Therefore, a current can efficiently flow from an anode to a cathode, and the efficient rectification operation by the rectifier circuit 10 can be implemented.

In the rectifier circuit 10 in FIGS. 11 and 12, the diode group GD3 is provided as the rectifier element group GRF3. The diode group GD4 is provided as the rectifier element group GRF4. The diode group GD3 that is the third diode group includes the diode Dp and the diode Dp+1 adjacent to the diode Dp in the direction DR2. The diode Dp that is the p-th diode and the diode Dp+1 that is the (p+1)-th diode are arranged side by side along the direction DR2, for example, with the direction DR1 as the longitudinal direction. The diode group GD3 further includes the diode Dp+2 adjacent to the diode Dp+1 in the direction DR2.

The diode group GD4 includes the diode Dq and the diode Dq+1 adjacent to the diode Dq in the direction DR2. The diode Dq that is the q-th diode and the diode Dq+1 that is the (q+1)-th diode are arranged side by side along the direction DR2, for example, with the direction DR1 as the longitudinal direction. The diode group GD4 further includes the diode Dq+2 adjacent to the diode Dq+1 in the direction DR2.

In this way, the diodes Dp and Dp+1 are arranged below input lines corresponding to the diodes Dp and Dp+1 in the input line group GI1 to supply the alternating-current voltage VC1. Further, the diodes Dq and Dq+1 are arranged below input lines corresponding to the diodes Dq and Dq+1 in the input line group GI2 to supply the alternating-current voltage VC2. Therefore, the plural diodes of the diode group GD3 can be efficiently arranged in the intersection region of the input line group GI1 and the output line group GQ2, and the plural diodes of the diode group GD4 can be efficiently arranged in the intersection region of the input line group GI2 and the output line group GQ2. The layout area of the rectifier circuit 10 can be reduced. In addition, the plural diodes coupled in parallel are provided between the input line group GI1 and the output line group GQ2, and the plural diodes coupled in parallel are provided between the input line group GI2 and the output line group GQ2. Therefore, a current flowing through the rectifier elements can be increased and the efficient rectification operation by the rectifier circuit 10 can be implemented.

In FIGS. 11 and 12, a common cathode CCAp shared by an anode ANp of the diode Dp and an anode ANp+1 of the diode Dp+1 is provided between the anode ANp and the anode ANp+1. A common cathode CCAp+1 shared by the anode ANp+1 and an anode ANp+2 of the diode Dp+2 is provided between the anode ANp+1 and the anode ANp+2. The anodes ANp, ANp+1, and ANp+2 are a p-th anode, a (p+1)-th anode, and a (p+2)-th anode, respectively. The common cathodes CCAp and CCAp+1 are a p-th common cathode and a (p+1)-th common cathode, respectively.

In FIGS. 11 and 12, a common cathode CCAq shared by an anode ANq of the diode Dq and an anode ANq+1 of the diode Dq+1 is provided between the anode ANq and the anode ANq+1. A common cathode CCAq+1 shared by the anode ANq+1 and an anode ANq+2 of the diode Dq+2 is provided between the anode ANq+1 and the anode ANq+2. The anodes ANq, ANq+1, and ANq+2 are a q-th anode, a (q+1)-th anode, and a (q+2)-th anode, respectively. The common cathodes CCAq and CCAq+1 are a q-th common cathode and a (q+1)-th common cathode, respectively.

In this way, in two anodes arranged along the direction DR2, a cathode arranged between the two anodes can be used as a common cathode of the two anodes. Therefore, the efficiency of the rectification operation by the rectifier circuit 10 can be improved and the area of the rectifier circuit 10 can be reduced.

In FIGS. 11 and 12, a cathode CA3 is provided to surround each of the anodes ANp, ANp+1, and ANp+2. A cathode CA4 is provided to surround each of the anodes ANq, ANq+1, and ANq+2. In this way, currents flow from the anodes ANp, ANp+1, and ANp+2 to the cathode CA3 in the upward, downward, leftward, and rightward directions. Currents flow from the anodes ANq, ANq+1, and ANq+2 to the cathode CA4 in the upward, downward, leftward, and rightward directions. Therefore, a current can efficiently flow from an anode to a cathode, and the efficient rectification operation by the rectifier circuit 10 can be implemented.

Further, in FIGS. 11 and 12, the anode ANi and the common cathode CCAp are arranged side by side along the direction DR1. The anode ANj and the common cathode CCAq are arranged side by side along the direction DR1.

That is, the anode ANi of the diode Di of the diode group GD1 and the common cathode CCAp shared by the anode ANp of the diode Dp and the anode ANp+1 of the diode Dp+1 of the diode group GD3 are arranged side by side along the direction DR1. Similarly, the anode ANi+1 of the diode group GD1 and the common cathode CCAp+1 of the diode group GD3 are arranged side by side along the direction DR1.

The anode ANj of the diode Dj of the diode group GD3 and the common cathode CCAq shared by the anode ANq of the diode Dq and the anode ANq+1 of the diode Dq+1 of the diode group GD4 are arranged side by side along the direction DR1. Similarly, the anode ANj+1 of the diode group GD2 and the common cathode CCAq+1 of the diode group GD4 are arranged side by side along the direction DR1.

For example, the anode ANi in FIGS. 11 and 12 corresponds to the anode of the diode D1 in FIG. 6, and the common cathode CCAp corresponds to the cathode of the diode D3. A contact is provided at a position where the anode ANi and an input line corresponding to the anode ANi overlap in the plan view. The node N1 of the alternating-current voltage VC1 is coupled to the anode ANi that is the anode of the diode D1 by coupling the anode ANi and the input line via the contact. In addition, a contact is provided at a position where the common cathode CCAp and the input line overlap in the plan view. The node N1 of the alternating-current voltage VC1 is coupled to the common cathode CCAp that is the cathode of the diode D3 by coupling the common cathode CCAp and the input line via the contact. Therefore, by arranging the anode ANi and the common cathode CCAp side by side along the direction DR1, the anode of the diode D1 and the cathode of the diode D3 in FIG. 6 can be coupled by a coupling path of a short path via the input line and the contacts. Therefore, a parasitic resistance in the coupling path and power loss caused by the parasitic resistance can be reduced.

The anode ANj in FIGS. 11 and 12 corresponds to the anode of the diode D2 in FIG. 6, and the common cathode CCAq corresponds to the cathode of the diode D4. A contact is provided at a position where the anode ANj and an input line corresponding to the anode ANj overlap in the plan view. The node N2 of the alternating-current voltage VC2 is coupled to the anode ANj that is the anode of the diode D2 by coupling the anode ANj and the input line via the contact. In addition, a contact is provided at a position where the common cathode CCAq and the input line overlap in the plan view. The node N2 of the alternating-current voltage VC2 is coupled to the common cathode CCAq that is the cathode of the diode D4 by coupling the common cathode CCAq and the input line via the contact. Therefore, by arranging the anode ANj and the common cathode CCAq side by side along the direction DR1, the anode of the diode D2 and the cathode of the diode D4 in FIG. 6 can be coupled by a coupling path of a short path via the input line and the contacts. Therefore, a parasitic resistance in the coupling path and power loss caused by the parasitic resistance can be reduced.

In FIGS. 11 and 12, the transistor T1 is arranged on the direction DR1 side of the diode group GD3. For example, the transistor T1 is arranged adjacent to the diode group GD3 on the direction DR1 side such that a longitudinal direction of a source S, a gate G, and a drain D that constitute the transistor T1 is along the direction DR2. The transistor T2 is arranged on the direction DR1 side of the diode group GD4. For example, the transistor T2 is arranged adjacent to the diode group GD4 on the direction DR1 side such that a longitudinal direction of a source S, a gate G, and a drain D that constitute the transistor T2 is along the direction DR2. In this way, not only the diode groups GD1, GD2, GD3, and GD4 but also the transistors T1 and T2 can be efficiently arranged with a compact layout arrangement. The alternating-current voltage VC2 from the input line group GI2 is supplied to the gate G of the transistor T1 by a wiring indicated by H1 in FIG. 11. The alternating-current voltage VC1 from the input line group GI1 is supplied to the gate G of the transistor T2 by a wiring indicated by H2.

The layout arrangement of the rectifier circuit 10 in the present embodiment is not limited to FIGS. 11 and 12, and various modifications can be made. For example, the layout arrangement of the transistors T1 and T2 in FIGS. 11 and 12 is unnecessary in the rectifier circuit 10 according to the first configuration example in FIG. 4. In addition, the layout arrangement of the diode groups GD3 and GD4 in FIGS. 11 and 12 is unnecessary in the rectifier circuit 10 according to the second configuration example in FIG. 5.

Figure 13:
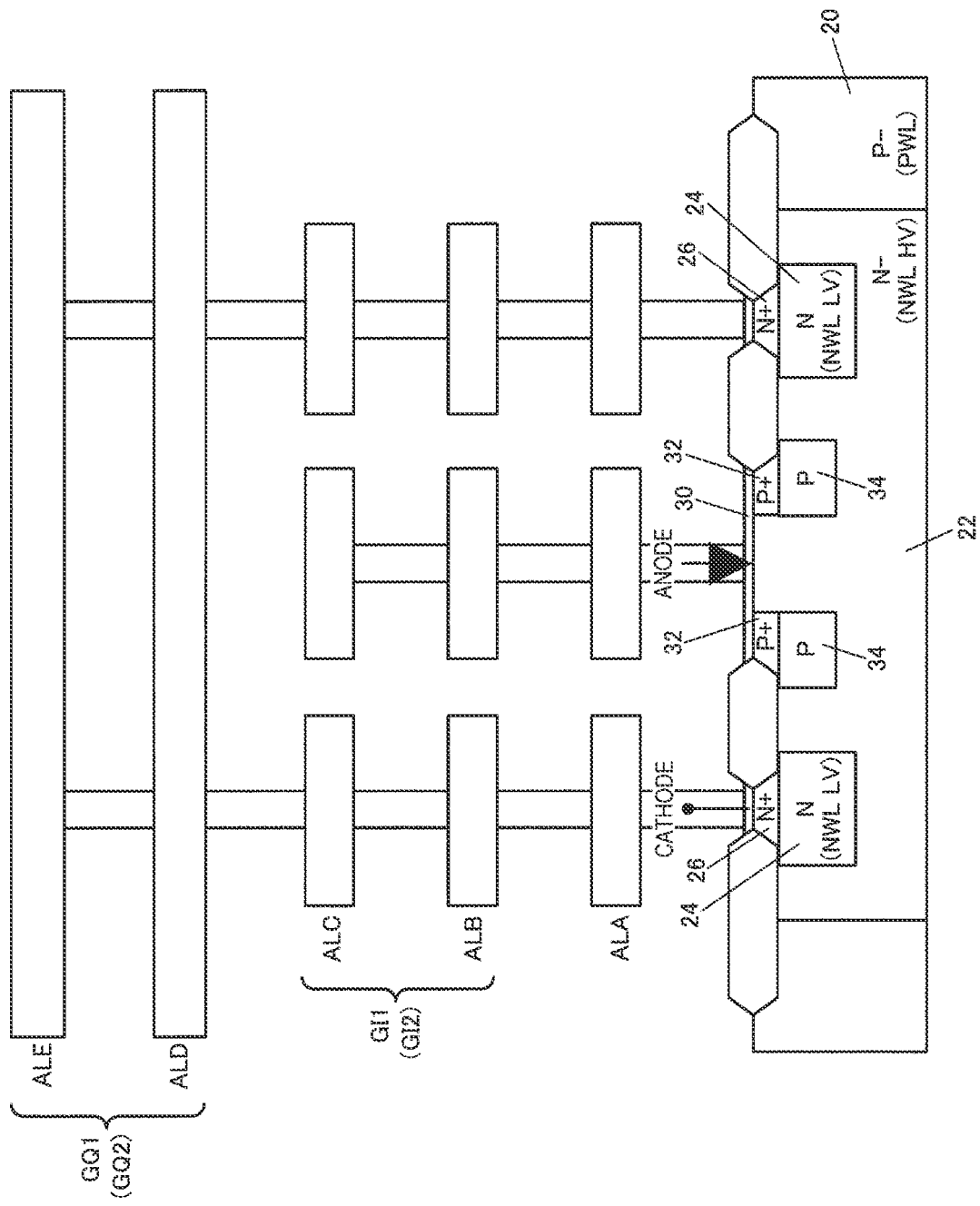
FIG. 13 is a cross-sectional view of the rectifier circuit.

FIG. 13 is a cross-sectional view of a portion of the rectifier circuit 10 indicated by a dotted line of Y in FIG. 12. As shown in FIG. 13, the input lines of the input line groups GI1 and GI2 are formed by metal layers ALB and ALC. The output lines of the output line groups GQ1 and GQ2 are formed by metal layers ALD and ALE above the metal layers ALB and ALC. Accordingly, the output line groups GQ1 and GQ2 can be wired to intersect the input line groups GI1 and GI2 along the direction DR1. A metal layer ALA for coupling to a diode or the like is provided below the metal layer ALB. The metal layers ALA to ALE are formed of, for example, a metal such as aluminum.

In FIG. 13, a P-type well 20 and an N-type well 22 are formed in the semiconductor substrate, and N-type wells 24 are formed in the N-type well 22. The N-type well 22 is, for example, a high breakdown voltage N-type well for a high voltage. The N-type wells 24 are, for example, low breakdown voltage N-type wells for a low voltage. An N-type diffusion layer 26 formed on a corresponding one of the N-type wells 24 serves as an electrode of a cathode of a Schottky barrier diode. P-type buried layers 34 are formed in the N-type well 22. P-type diffusion layers 32 are formed on the P-type buried layers 34, respectively. A metal layer 30 is formed on the P-type diffusion layers 32. The metal layer 30 and the like serves as an electrode of an anode of a Schottky barrier diode. As the metal layer 30, for example, cobalt or a cobalt alloy is used. Specifically, cobalt silicide is used. However, titanium or a titanium alloy may be used as the metal layer 30. For example, the Schottky barrier diode is implemented by a Schottky barrier generated by joining the metal layer 30 and the N-type well 22. In FIG. 13, P+>P>P− is established for a P type impurity concentration, and N+>N>N− is established for an N type impurity concentration. A structure of the Schottky barrier diode is not limited to the structure in FIG. 13, and various modifications can be made. For example, a structure may be adopted in which a plurality of P-type diffusion layers and electrodes are arranged in a divided manner with respect to an N-type well. In the present embodiment, it is desirable to use the Schottky barrier diode as the diodes D1 to D4, and a modification in which PN junction diodes are used as the diodes D1 to D4 also can be made. In this case, for example, a P-type diffusion layer serving as an anode of the PN junction diode and an N-type diffusion layer serving as a cathode of the PN junction diode may be formed in the N-type well. The diffusion layers are impurity layers.

Figure 14:
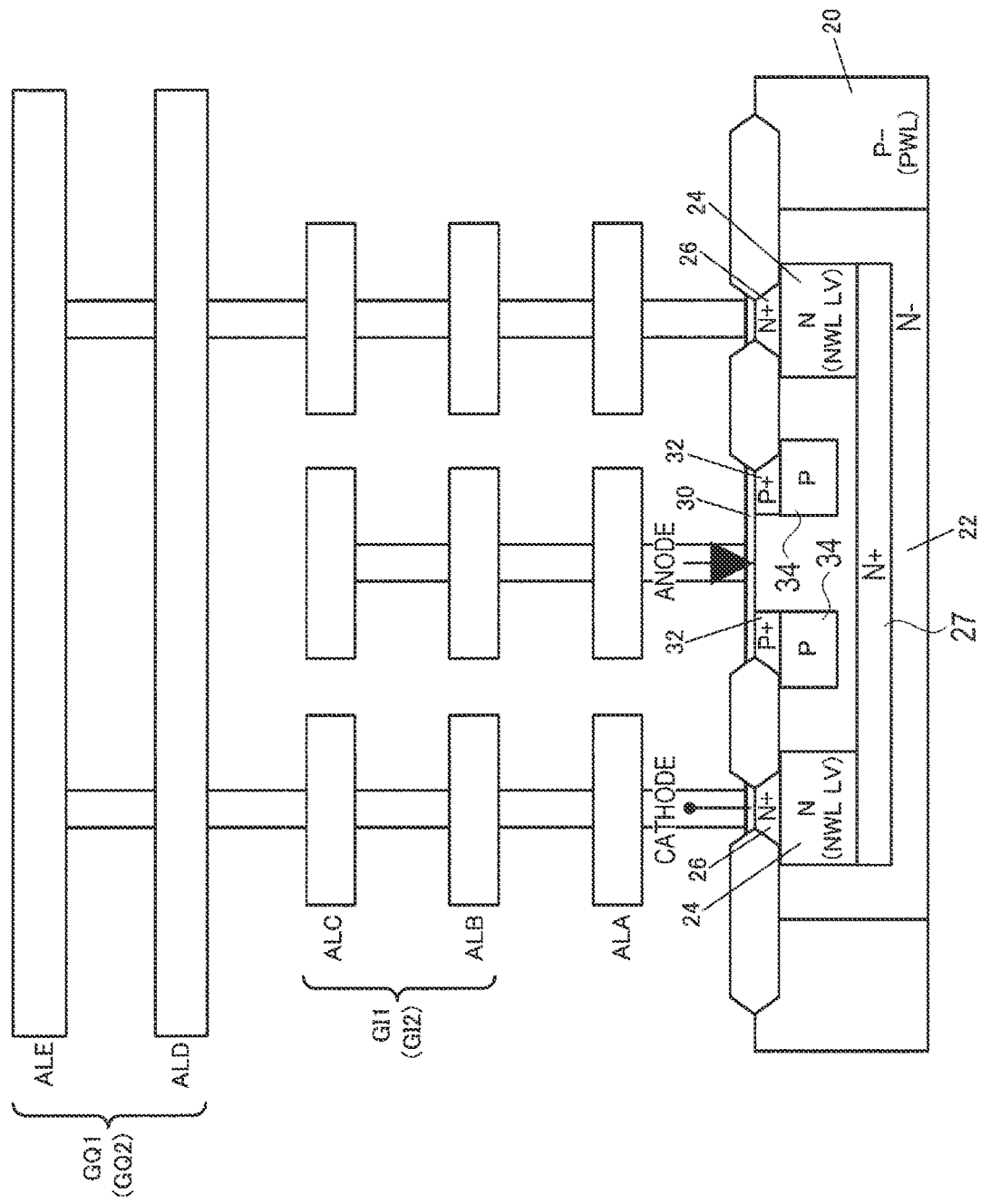
FIG. 14 is a cross-sectional view of another aspect of the rectifier circuit.

FIG. 14 is a cross-sectional view of another aspect of the rectifier circuit 10, and corresponds to FIG. 13. In the diode configuration in FIG. 13, an N-type diffusion region 27 may be provided between the two N-type wells 24 as shown in FIG. 14. The N-type diffusion region 27 is a region in which an impurity concentration is increased, and couples the two N-type wells 24. Since the N-type diffusion region 27 has a higher impurity concentration than that in the N-type well region, an electric resistance of the N-type diffusion region 27 is small. In a preferred example, the impurity concentration in the N-type diffusion region 27 is an impurity concentration N+ that is the same as that in the N-type diffusion layer 26. The impurity concentration in the N-type diffusion region 27 is not limited to the impurity concentration N+, and may be higher than the impurity concentration (impurity concentration N−) in the N-type well 22 region that is a base.

Figure 15:
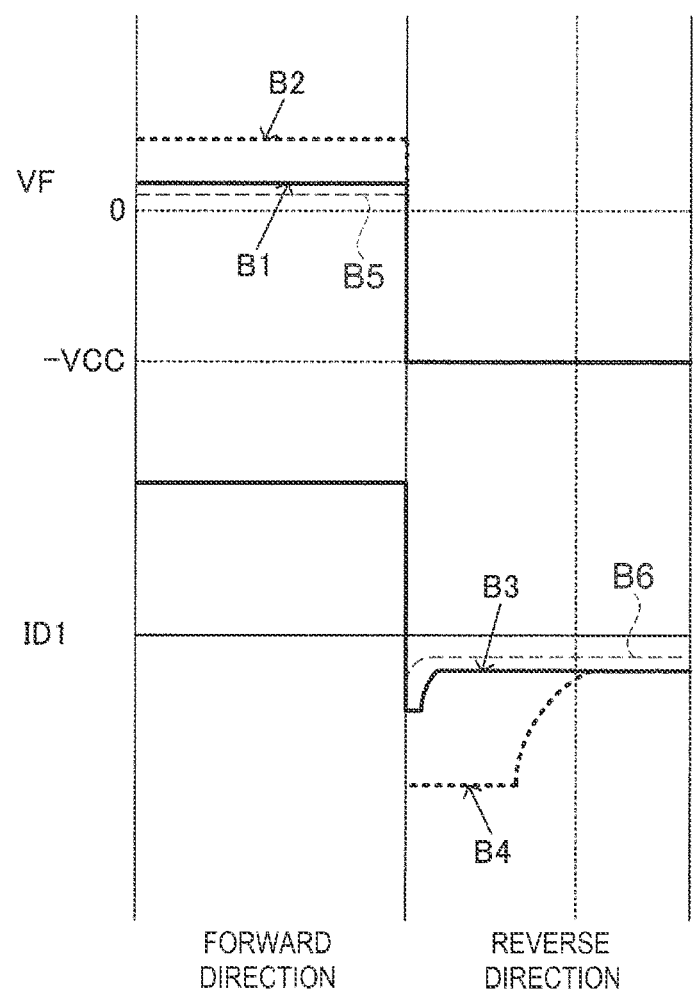
FIG. 15 is a diagram showing an operation of a rectifier circuit according to another aspect.

FIG. 15 is a diagram showing a correlation between the forward voltage and the current ID1 VF of a diode, and corresponds to FIG. 8. According to the diode configuration provided with the N-type diffusion region 27 in FIG. 14, a coupling resistance between the two N-type wells 24 is lower than that of the configuration in FIG. 13, so that the forward voltage VF can be lowered. More specifically, as shown in FIG. 15, a voltage B5 can be lower than a voltage B1 indicating the forward voltage VF of the diode in FIG. 13. Then, a current B6 can be lower than a current B3 indicating a reverse current ID1 of the diode in FIG. 13. That is, according to the diode configuration in FIG. 14, the power loss can be further reduced.

4. Power Reception Control Device

Figure 16:
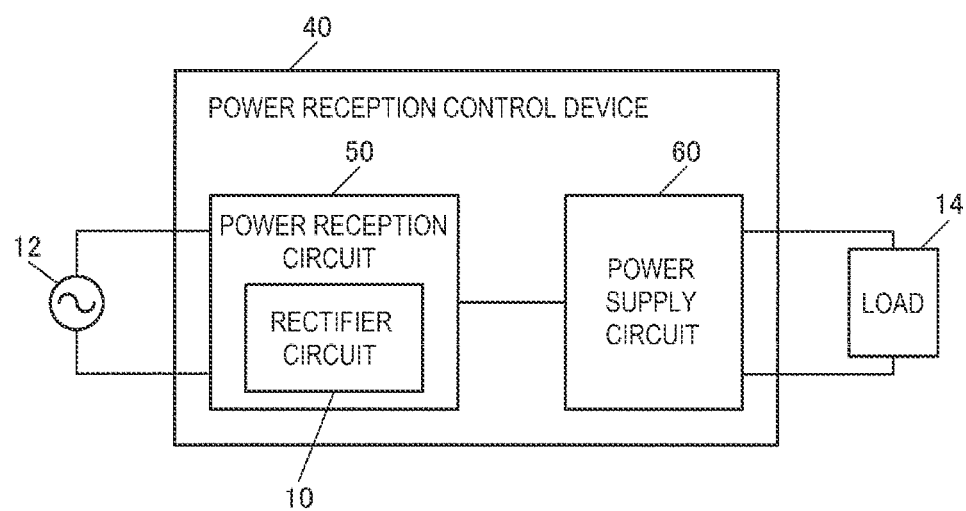
FIG. 16 shows a configuration example of a power reception control device according to the present embodiment.

FIG. 16 shows a configuration example of a power reception control device 40 according to the present embodiment. As shown in FIG. 16, the power reception control device 40 in the present embodiment includes a power reception circuit 50 having the rectifier circuit 10 in the present embodiment, and a power supply circuit 60 that supplies power based on reception power of the power reception circuit 50. For example, the power reception circuit 50 rectifies alternating-current voltages from the alternating-current power supply 12 by the rectifier circuit 10 to generate the rectified voltages VCC and VSS, and supplies a reception voltage based on the rectified voltages VCC and VSS to the power supply circuit 60 as the reception power. The power supply circuit 60 supplies power to the load 14 based on the reception power of the power reception circuit 50. The alternating-current power supply 12, for example, may be an AC power supply, or may be an alternating-current power supply by a secondary coil in contactless power transmission.

Figure 17:
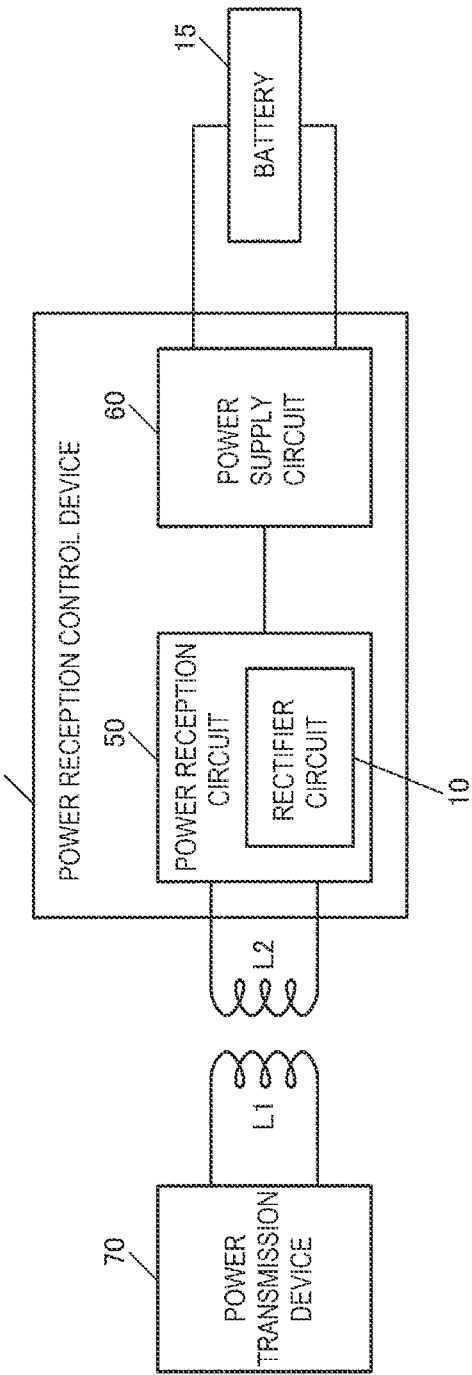
FIG. 17 shows a configuration example of the power reception control device according to the present embodiment.

FIG. 17 shows another configuration example of the power reception control device 40 according to the present embodiment. In FIG. 17, the power reception control device receives power by contactless power transmission. Specifically, the power reception circuit 50 of the power reception control device 40 receives transmission power of the power transmission device 70 in a contactless manner. That is, the power is wirelessly received. For example, a primary coil L1 is provided on the power transmission device 70 side, and the secondary coil L2 is provided on the power reception control device 40 side. The power is transmitted from the primary coil L1 to the secondary coil L2 by applying an alternating-current voltage to the primary coil L1 by a power transmission driver of the power transmission device 70. The power reception circuit 50 receives the power from the power transmission device 70. Specifically, the power reception circuit 50 converts an alternating-current induced voltage of the secondary coil L2 into the direct-current rectified voltage VCC by the rectifier circuit 10. The power supply circuit 60 charges a battery 15 that is the load 14 based on a reception voltage based on the rectified voltage VCC.

The power reception control device 40 in the present embodiment can be incorporated into an electronic apparatus. As the electronic apparatus in which the power reception control device 40 is incorporated, for example, a bearable apparatus such as an earphone or a wearable apparatus is preferable, and the present embodiment is not limited thereto. As the electronic apparatus, for example, various apparatuses such as a head-mounted display, a portable communication terminal such as a smartphone or a mobile phone, a watch, a biological information measuring apparatus, a shaver, an electric toothbrush, a wrist computer, a handy terminal, or an in-vehicle apparatus of an automobile can be assumed.

As described above, the rectifier circuit in the present embodiment is a rectifier circuit that receives a first alternating-current voltage and a second alternating-current voltage whose phase is opposite to a phase of the first alternating-current voltage and outputs a first rectified voltage on a high potential side and a second rectified voltage on a low potential side. The rectifier circuit includes a first input line to which the first alternating-current voltage is supplied and that is wired along a first direction, and a second input line to which the second alternating-current voltage is supplied and that is wired along the first direction on a second direction side of the first input line when a direction orthogonal to the first direction is a second direction. The rectifier circuit includes a first output line that is an output line of the first rectified voltage and is wired along the second direction, and a second output line that is an output line of the second rectified voltage and is wired along the second direction on a first direction side of the first output line. The rectifier circuit includes a first rectifier element that is arranged corresponding to an intersection of the first input line and the first output line in a plan view and is coupled between the first input line and the first output line, and a second rectifier element that is arranged corresponding to an intersection of the second input line and the first output line in the plan view and is coupled between the second input line and the first output line. The rectifier circuit includes a third rectifier element that is arranged corresponding to an intersection of the first input line and the second output line in the plan view and is coupled between the first input line and the second output line, and a fourth rectifier element that is arranged corresponding to an intersection of the second input line and the second output line in the plan view and is coupled between the second input line and the second output line.

According to the present embodiment, the first input line of the first alternating-current voltage and the second input line of the second alternating-current voltage are wired along the first direction. The first output line of the first rectified voltage and the second output line of the second rectified voltage are wired along the second direction orthogonal to the first direction. The first rectifier element and the second rectifier element are arranged corresponding to the intersection of the first input line and the first output line and the intersection of the second input line and the first output line. The third rectifier element and the fourth rectifier element are arranged corresponding to the intersection of the first input line and the second output line and the intersection of the second input line and the second output line. Accordingly, a parasitic resistance between each of the rectifier elements and each of the input lines or each of the output lines and power reception loss of the rectifier circuit can be reduced. In addition, an efficient layout arrangement of the rectifier elements and efficient layout wiring of the input lines and the output lines can be implemented, and a layout area of the rectifier circuit can be reduced.

In the present embodiment, the rectifier circuit may further include a first input line group including the first input line, a second input line group including the second input line, a first output line group including the first output line, and a second output line group including the second output line. Input lines of the first input line group may be wired along the first direction. Input lines of the second input line group may be wired along the first direction on the second direction side of the first input line group. Output lines of the first output line group may be wired along the second direction. The output lines of the second output line group may be wired along the second direction on the first direction side of the first output line group.

In this way, the first alternating-current voltage and the second alternating-current voltage are input to the rectifier circuit by the plurality of input lines of the first input line group and the second input line group. The first rectified voltage and the second rectified voltage can be output from the rectifier circuit by the plurality of output lines of the first output line group and the second output line group. Accordingly, for example, the power reception loss can be reduced by reducing the parasitic resistance.

In the present embodiment, the rectifier circuit may further include a first rectifier element group including the first rectifier element and a second rectifier element group including the second rectifier element. The first rectifier element group may be arranged corresponding to an intersection of the first input line group and the first output line group. The second rectifier element group may be arranged corresponding to an intersection of the second input line group and the first output line group.

In this way, for example, the rectifier circuit can execute the rectification by the first rectifier element group including a plurality of rectifier elements and the second rectifier element group including a plurality of rectifier elements. Therefore, the power reception loss of the rectifier circuit can be further reduced and an efficient rectification operation can be implemented.

In the present embodiment, a first diode group may be provided as the first rectifier element group. A second diode group may be provided as the second rectifier element group. The first diode group may include an i-th diode and an (i+1)-th diode adjacent to the i-th diode in the second direction. The second diode group may include a j-th diode and a (j+1)-th diode adjacent to the j-th diode in the second direction.

In this way, each of the i-th diode and the (i+1)-th diode can be arranged at a location of a corresponding input line of the first input line group. Each of the j-th diode and the (j+1)-th diode can be arranged at a location of a corresponding input line of the second input line group. Accordingly, a plurality of diodes of the first diode group can be efficiently arranged corresponding to the intersection of the first input line group and the first output line group. A plurality of diodes of the second diode group can be efficiently arranged corresponding to the intersection of the second input line group and the first output line group.

In the present embodiment, an i-th common cathode shared by an i-th anode of the i-th diode and an (i+1)-th anode of the (i+1)-th diode may be arranged between the i-th anode and the (i+1)-th anode. A j-th common cathode shared by a j-th anode of the j-th diode and a (j+1)-th anode of the (j+1)-th diode may be arranged between the j-th anode and the (j+1)-th anode.

In this way, in two anodes arranged along the second direction, a cathode arranged between the two anodes can be used as a common cathode of the two anodes.

In the present embodiment, a third diode group may be provided as the third rectifier element group. A fourth diode group may be provided as the fourth rectifier element group. The third diode group may include a p-th diode and a (p+1)-th diode adjacent to the p-th diode in the second direction. The fourth diode group may include a q-th diode and a (q+1)-th diode adjacent to the q-th diode in the second direction.

In this way, each of the p-th diode and the (p+1)-th diode can be arranged at a location of a corresponding input line of the first input line group. Each of the q-th diode and the (q+1)-th diode can be arranged at a location of a corresponding input line of the second input line group. Accordingly, a plurality of diodes of the third diode group can be efficiently arranged corresponding to the intersection of the first input line group and the second output line group. A plurality of diodes of the fourth diode group can be efficiently arranged corresponding to the intersection of the second input line group and the second output line group.

In the present embodiment, a p-th common cathode shared by a p-th anode of the p-th diode and a (p+1)-th anode of the (p+1)-th diode may be arranged between the p-th anode and the (p+1)-th anode. A q-th common cathode shared by a q-th anode of the q-th diode and a (q+1)-th anode of the (q+1)-th diode may be arranged between the q-th anode and the (q+1)-th anode. The i-th anode and the p-th common cathode may be arranged side by side along the first direction. The j-th anode and the q-th common cathode may be arranged side by side along the first direction.

In this way, in two anodes arranged along the second direction, a cathode arranged between the two anodes can be used as a common cathode of the two anodes. In the present embodiment, the i-th anode and the p-th common cathode are arranged side by side along the first direction. The j-th anode and the q-th common cathode are arranged side by side along the first direction. Accordingly, the anode of the i-th diode and the cathode of the p-th diode can be coupled by a signal line of a short path. The anode of the j-th diode and the cathode of the q-th diode can be coupled by a signal line of a short path.

In the present embodiment, a first diode may be provided as the first rectifier element. A second diode may be provided as the second rectifier element.

In this way, the rectifier circuit can be operated at a high speed as compared with a case where transistors are used as the first rectifier element and the second rectifier element. For example, even when a frequency of the first alternating-current voltage and the frequency of the second alternating-current voltage are high, the first alternating-current voltage and the second alternating-current voltage can be appropriately rectified to output the first rectified voltage and the second rectified voltage.

In the present embodiment, the first diode may be a first Schottky barrier diode, and the second diode may be a second Schottky barrier diode.

When the Schottky barrier diodes are used as described above, a forward voltage can be reduced as compared with that when PN junction diodes are used, and thus the power loss can be reduced, and the power reception efficiency of the rectifier circuit can be improved.

In the present embodiment, a first transistor that has a gate coupled to the second input line may be provided as the third rectifier element. A second transistor that has a gate coupled to the first input line may be provided as the fourth rectifier element.

In this way, the first transistor can be operated as the third rectifier element by inputting the second alternating-current voltage from the second input line to the gate of the first transistor and turning on and off the first transistor. The second transistor can be operated as the fourth rectifier element by inputting the first alternating-current voltage from the first input line to the gate of the second transistor and turning on and off the second transistor.

In the present embodiment, a third Schottky barrier diode coupled in parallel with the first transistor may be further provided as the third rectifier element. A fourth Schottky barrier diode coupled in parallel with the second transistor may be further provided as the fourth rectifier element.

In this way, the power loss can be reduced as compared with that in the configuration in which the third Schottky barrier diode and the fourth Schottky barrier diode are not provided.

In the present embodiment, a third Schottky barrier diode may be provided as the third rectifier element. A fourth Schottky barrier diode may be provided as the fourth rectifier element.

By using the Schottky barrier diodes as described above, the forward voltage and the power loss can be reduced as compared with those when the PN junction diodes are used.

The present embodiment relates to a power reception control device including the power reception circuit including the rectifier circuit described above, and a power supply circuit configured to supply power based on reception power of the power reception circuit.

Although the present embodiment has been described in detail above, it will be easily understood by those skilled in the art that many modifications can be made without substantially departing from novel matters and effects of the present disclosure. Therefore, all such modifications are intended to be included within the scope of the present disclosure. For example, a term cited with a different term having a broader meaning or the same meaning at least once in the description or in the drawings can be replaced with the different term in any place in the description or in the drawings. Further, all combinations of the present embodiment and the modifications are also included in the scope of the present disclosure. The configurations, operations, and the like of the rectifier circuit and the power reception control device are not limited to those described in the present embodiment, and various modifications can be made.

What is claimed is:

1. A rectifier circuit that receives a first alternating-current voltage and a second alternating-current voltage whose phase is opposite to a phase of the first alternating-current voltage and outputs a first rectified voltage on a high potential side and a second rectified voltage on a low potential side, the rectifier circuit comprising:
    a first input line to which the first alternating-current voltage is supplied and that is wired and extends along a first direction;
    a second input line to which the second alternating-current voltage is supplied and that is wired and extends along the first direction, the second input line being parallel to the first input line and located on a second direction side of the first input line when a direction orthogonal to the first direction is defined as a second direction;
    a first output line that is an output line of the first rectified voltage and that is wired and extends along the second direction;
    a second output line that is an output line of the second rectified voltage and that is wired and extends along the second direction, the second output line being parallel to the first output line and located on a first direction side of the first output line;
    a first rectifier element that is arranged at an intersection of the first input line and the first output line in a plan view and is coupled between the first input line and the first output line;
    a second rectifier element that is arranged at an intersection of the second input line and the first output line in the plan view and is coupled between the second input line and the first output line;
    a third rectifier element that is arranged at an intersection of the first input line and the second output line in the plan view and coupled between the first input line and the second output line; and
    a fourth rectifier element that is arranged at an intersection of the second input line and the second output line in the plan view and is coupled between the second input line and the second output line.

2. The rectifier circuit according to claim 1, further comprising:
    a first input line group including a plurality of the first input lines;
    a second input line group including a plurality of the second input lines;
    a first output line group including a plurality of the first output lines; and
    a second output line group including a plurality of the second output lino lines, wherein
    input lines of the first input line group are wired and extend along the first direction,
    input lines of the second input line group are wired and extend along the first direction, and the second input line group are parallel to the first input line group and located on the second direction side of the first input line group,
    output lines of the first output line group are wired and extend along the second direction, and
    output lines of the second output line group are wired and extend along the second direction on the first direction side of the first output line group.

3. The rectifier circuit according to claim 2, further comprising:
    a first rectifier element group including a plurality of the first rectifier elements; and
    a second rectifier element group including a plurality of the second rectifier elements, wherein
    the first rectifier element group is arranged at an intersection of the first input line group and the first output line group, and
    the second rectifier element group is arranged at an intersection of the second input line group and the first output line group.

4. The rectifier circuit according to claim 3, wherein
    a first diode group is provided as the first rectifier element group,
    a second diode group is provided as the second rectifier element group,
    the first diode group includes
        an i-th diode, and
        an (i+1)-th diode adjacent to the i-th diode in the second direction, and
    the second diode group includes
        a j-th diode, and
        a (j+1)-th diode adjacent to the j-th diode in the second direction.

5. The rectifier circuit according to claim 4, wherein
    an i-th common cathode shared by an i-th anode of the i-th diode and an (i+1)-th anode of the (i+1)-th diode is arranged between the i-th anode and the (i+1)-th anode, and
    a j-th common cathode shared by a j-th anode of the j-th diode and a (j+1)-th anode of the (j+1)-th diode is arranged between the j-th anode and the (j+1)-th anode.

6. The rectifier circuit according to claim 5, wherein
a third diode group is provided as the third rectifier element group,
a fourth diode group is provided as the fourth rectifier element group,
the third diode group includes
a p-th diode, and
a (p+1)-th diode adjacent to the p-th diode in the second direction, and
the fourth diode group includes
a q-th diode, and
a (q+1)-th diode adjacent to the q-th diode in the second direction.

7. The rectifier circuit according to claim 6, wherein
a p-th common cathode shared by a p-th anode of the p-th diode and a (p+1)-th anode of the (p+1)-th diode is arranged between the p-th anode and the (p+1)-th anode,
a q-th common cathode shared by a q-th anode of the q-th diode and a (q+1)-th anode of the (q+1)-th diode is arranged between the q-th anode and the (q+1)-th anode,
the i-th anode and the p-th common cathode are arranged side by side along the first direction, and
the j-th anode and the q-th common cathode are arranged side by side along the first direction.

8. The rectifier circuit according to claim 1, wherein
a first diode is provided as the first rectifier element, and
a second diode is provided as the second rectifier element.

9. The rectifier circuit according to claim 8, wherein
the first diode is a first Schottky barrier diode, and
the second diode is a second Schottky barrier diode.

10. The rectifier circuit according to claim 8, wherein
a first transistor that has a gate coupled to the second input line is provided as the third rectifier element, and
a second transistor that has a gate coupled to the first input line is provided as the fourth rectifier element.

11. The rectifier circuit according to claim 10, wherein
a third Schottky barrier diode coupled in parallel with the first transistor is further provided as the third rectifier element, and
a fourth Schottky barrier diode coupled in parallel with the second transistor is further provided as the fourth rectifier element.

12. The rectifier circuit according to claim 8, wherein
a third Schottky barrier diode is provided as the third rectifier element, and
a fourth Schottky barrier diode is provided as the fourth rectifier element.

13. A power reception control device comprising:
a power reception circuit including the rectifier circuit according to claim 1; and
a power supply circuit configured to supply power based on reception power of the power reception circuit.

\* \* \* \* \*